(12) United States Patent
Noda

(10) Patent No.: US 8,362,583 B2
(45) Date of Patent: Jan. 29, 2013

(54) PYROELECTRIC DETECTOR, PYROELECTRIC DETECTION DEVICE, AND ELECTRONIC INSTRUMENT

(75) Inventor: Takafumi Noda, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 84 days.

(21) Appl. No.: 13/166,912

(22) Filed: Jun. 23, 2011

(65) Prior Publication Data

US 2011/0316111 A1 Dec. 29, 2011

(30) Foreign Application Priority Data

Jun. 25, 2010 (JP) .................................. 2010-144897

(51) Int. Cl.
*H01L 37/00* (2006.01)

(52) U.S. Cl. ......... 257/467; 257/E29.347; 257/E27.098; 257/E21.008; 257/295

(58) Field of Classification Search .................. 257/467, 257/E29.347, E27.098, E21.008
See application file for complete search history.

(56) References Cited

U.S. PATENT DOCUMENTS

| | | | |
|---|---|---|---|
| 4,894,544 A | 1/1990 | Turnbull | |
| 6,034,374 A | 3/2000 | Kimura et al. | |
| 7,812,385 B2 | 10/2010 | Noda | |
| 7,825,027 B2 | 11/2010 | Noda et al. | |
| 2004/0256559 A1 | 12/2004 | Ryu et al. | |
| 2006/0043446 A1 | 3/2006 | Fukada | |
| 2006/0054823 A1 | 3/2006 | Yon et al. | |
| 2007/0134817 A1 | 6/2007 | Noda | |
| 2008/0303074 A1 | 12/2008 | Noda | |
| 2009/0068763 A1 | 3/2009 | Noda | |
| 2009/0072287 A1* | 3/2009 | Noda ........................... 257/295 |
| 2009/0127604 A1 | 5/2009 | Noda | |
| 2009/0207879 A1 | 8/2009 | Kurashina | |

FOREIGN PATENT DOCUMENTS

| | | |
|---|---|---|
| EP | 0827216 A2 | 3/1998 |
| EP | 2105719 A1 | 9/2009 |
| EP | 2105963 A2 | 9/2009 |
| JP | 09-196765 A | 7/1997 |
| JP | 10-104062 A | 4/1998 |
| JP | 2007-150025 A | 6/2007 |
| JP | 2008-218782 A | 9/2008 |
| JP | 2008-232896 A | 10/2008 |
| JP | 2009-065089 A | 3/2009 |
| JP | 2009-071022 A | 4/2009 |
| JP | 2009-071241 A | 4/2009 |
| JP | 2009-071242 A | 4/2009 |

(Continued)

OTHER PUBLICATIONS

Partial European Search Report dated Oct. 10, 2011 for the counterpart European Patent Application No. 11171304.6.

(Continued)

*Primary Examiner* — Marc Armand
(74) *Attorney, Agent, or Firm* — Global IP Counselors, LLP

(57) ABSTRACT

A pyroelectric detector includes a pyroelectric detection element mounted on a first side of a support member with a second side facing a cavity. The pyroelectric detection element has a capacitor including a first electrode, a pyroelectric body and a second electrode, and an interlayer insulation layer forming first and second contact holes passing respectively through to the first and second electrodes. First and second plugs are respectively embedded in the first and second contact holes, with first and second electrode wiring layers are respectively connected to the first and second plugs. A thermal conductivity of material of the second electrode wiring layer is lower than a thermal conductivity of material of a portion of the second electrode connected to the second plug.

20 Claims, 11 Drawing Sheets

FOREIGN PATENT DOCUMENTS

| | | |
|---|---|---|
| JP | 2009-124017 A | 6/2009 |
| JP | 2009-129972 A | 6/2009 |
| JP | 2009-130188 A | 6/2009 |
| JP | 2009-141179 A | 6/2009 |

OTHER PUBLICATIONS

Extended European Search Report dated Jul. 18, 2012 for the counterpart European Patent Application No. 11171304.6.

* cited by examiner

PYROELECTRIC DETECTOR, PYROELECTRIC DETECTION DEVICE, AND ELECTRONIC INSTRUMENT

CROSS-REFERENCE TO RELATED APPLICATIONS

This application claims priority to Japanese Patent Application No. 2010-144897 filed on Jun. 25, 2010. The entire disclosure of Japanese Patent Application No. 2010-144897 is hereby incorporated herein by reference.

BACKGROUND

1. Technical Field

The present invention relates to a pyroelectric detector, a pyroelectric detection device, and an electronic instrument or the like.

2. Related Art

Known pyroelectric detection devices include pyroelectric or bolometer-type infrared detection devices. An infrared detection device utilizes a change (pyroelectric effect or pyroelectronic effect) in the amount of spontaneous polarization of a pyroelectric body according to the light intensity (temperature) of received infrared rays to create an electromotive force (charge due to polarization) at both ends of the pyroelectric body (pyroelectric-type) or vary a resistance value according to the temperature (bolometer-type) and detect the infrared rays. Compared with a bolometer-type infrared detection device, a pyroelectric infrared detection device is complex to manufacture, but has the advantage of excellent detection sensitivity.

A cell of a pyroelectric infrared detection device has an infrared detection element which includes a capacitor composed of a pyroelectric body connected to an upper electrode and a lower electrode, and various proposals have been made regarding the electrode wiring structure or the material of the electrodes or the pyroelectric body (Japanese Laid-Open Patent Application Publication No. 10-104062 and Japanese Laid-Open Patent Application Publication No. 2008-232896).

A capacitor which includes a ferroelectric body connected to an upper electrode and a lower electrode is used in ferroelectric memory, and various proposals have been made regarding the material of the electrodes or the ferroelectric body to be suitable for ferroelectric memory (Japanese Laid-Open Patent Application Publication No. 2009-71242 and Japanese Laid-Open Patent Application Publication No. 2009-129972).

SUMMARY

In Japanese Laid-Open Patent Application Publication No. 10-104062, the lower electrode as such is extended so as to serve also as a lower electrode wiring, and the upper electrode as such is extended so as to serve also as an upper electrode wiring layer. A material having low electrical resistance (e.g., Pt, Ir, or the like) is used for the lower electrode and upper electrode of the capacitor in order to obtain the desired electrical characteristics, and the thermal conductivity thereof is also high (71.6 W/m·K for Pt, and 147 W/m·K for Ir). The heat of the infrared detection element is therefore transmitted to the outside via the lower electrode wiring or the upper electrode wiring in the technique of Japanese Laid-Open Patent Application Publication No. 10-104062. High characteristics therefore cannot be ensured in a pyroelectric infrared detector that operates according to a detection principle in which the amount of polarization of the pyroelectric body changes based on temperature.

As a modification of the technique of Japanese Laid-Open Patent Application Publication No. 10-104062, a stack configuration in which a lower electrode wiring layer is connected to a lower surface of the lower electrode, and an upper electrode wiring is connected to an upper surface of the upper electrode is used in ferroelectric memory.

In Japanese Laid-Open Patent Application Publication No. 2008-232896, a planar-type capacitor is developed which differs from that of this publication. In Japanese Laid-Open Patent Application Publication No. 2008-232896, a lower platinum layer (8) as a lower metal thin layer is formed on an $Al_2O_3$ thin layer (6) having crystalline properties which is formed on a single-crystal semiconductor substrate (4), a ferroelectric thin layer (10) is laminated on only a portion of an upper surface of the lower metal thin layer (8), and an upper platinum layer (12) as an upper metal thin layer is laminated on only a portion of an upper surface of the ferroelectric thin layer (8) (FIGS. 2 and 3, and Claim 1). Wiring (16) formed by a metal thin layer is connected to an exposed part not covered by an insulation layer (14) on the lower metal thin layer (8) and an upper surface of the upper metal thin layer (12) (Paragraph 0033).

However, Japanese Laid-Open Patent Application Publication No. 2008-232896 is concerned solely with the crystalline properties of the lower metal thin layer (8), the ferroelectric thin layer (10), and the upper metal thin layer (12), and is not concerned with protecting the capacitor from reducing gas, or with the dissipation of heat from the wiring (16).

An object of the several aspects of the present invention is to provide a pyroelectric detector, a pyroelectric detection device, and an electronic instrument whereby high detection characteristics can be realized while suppressing the dissipation of heat through the wiring from the pyroelectric detection element, in view of a detection principle in which the amount of polarization of a pyroelectric body changes based on temperature.

A pyroelectric detector according to one aspect of the present invention is includes a support member and a pyroelectric detection element. The support member includes a first side and a second side opposite from the first side, with the second side facing a cavity. The pyroelectric detection element is mounted on the first side of the support member. The pyroelectric detection element includes a capacitor, an interlayer insulation layer, a first plug, a second plug, a first electrode wiring layer, and a second electrode wiring layer. The capacitor includes a first electrode, a pyroelectric body and a second electrode, the first electrode being mounted on the support member and including a first region in which the pyroelectric body is disposed and a second region extending from the first region. The pyroelectric body is disposed over the first electrode in the first region, and the second electrode being disposed over the pyroelectric body. The interlayer insulation layer covers a surface of the capacitor, and forms a first contact hole passing through to the first electrode in the second region, and a second contact hole passing through to the second electrode. The first plug is embedded in the first contact hole. The second plug is embedded in the second contact hole. The first electrode wiring layer is formed on the interlayer insulation layer and on the first side of the support member, and connected to the first plug. The second electrode wiring layer is formed on the interlayer insulation layer and on the first side of the support member, and connected to the second plug. The thermal conductivity of material of the second electrode wiring layer is lower than a thermal conductivity of material of a portion of the second electrode connected to the second plug.

Through this aspect of the present invention, by adopting a planar-type capacitor structure, the drawbacks of the stack-type capacitor structure are overcome, and the sensor characteristics can be enhanced. Although the second electrode wiring layer connected to the pyroelectric body via the second plug and the second electrode is indispensible for driving the capacitor, the second electrode wiring simultaneously functions as a radiation path. In an aspect of the present invention, by making the thermal conductivity of the second electrode wiring layer lower than that of the second electrode, the radiation of heat from the pyroelectric body can be suppressed, and the thermal separation properties of the infrared detection element are enhanced.

In the pyroelectric detector as described above, a thermal conductivity of material of the first electrode wiring layer is preferably lower than a thermal conductivity of material of a portion of the first electrode connected to the first plug.

The first electrode wiring layer connected to the pyroelectric body via the first plug and the first electrode is also indispensible for driving the capacitor, but the first electrode wiring simultaneously functions as a radiation path. In an aspect of the present invention, by making the thermal conductivity of the first electrode wiring layer lower than that of the first electrode, the radiation of heat from the pyroelectric body can be suppressed, and the thermal separation properties of the infrared detection element are enhanced.

In the pyroelectric detector as described above, at least one of the first electrode wiring layer and the second electrode wiring layer preferably contains one of titanium nitride and titanium aluminum nitride.

The thermal conductivity of titanium nitride or titanium aluminum nitride is adequately smaller than that of the metal suitable for the first and second electrode material, e.g., platinum or iridium.

In the pyroelectric detector as described above, a thermal conductance of the second electrode is preferably greater than a thermal conductance of the first electrode. Since the first electrode directly touches the support member and diffuses heat by solid conduction, the thermal conductance of the first electrode is preferably low. On the other hand, since the second electrode does not directly touch the support member and other components, the thermal conductance of the second electrode may be greater than that of the first electrode. Even in this case, dissipation of heat from the side of the second electrode can be suppressed by reducing the thermal conductivity of the second electrode wiring layer.

In the pyroelectric detector as described above, the pyroelectric detection element further preferably includes a light-absorbing member disposed in a region further upstream in a light incidence direction than the second electrode and the second electrode wiring layer.

When the light-absorbing member is disposed further upstream in the light incidence direction than the capacitor, the heat due to light irradiation is transferred to the pyroelectric body from the light-absorbing member. Since the second electrode is present in this thermal conduction path, the suppression of radiation from the second electrode wiring layer connected to the second electrode contributes to increasing the efficiency of heat transfer from the light-absorbing member to the pyroelectric body. The thermal separation properties of the infrared detection element can be enhanced by merely reducing the thermal conductivity of the second electrode wiring layer to a value below that of the second electrode.

In the pyroelectric detector as described above, the light-absorbing member preferably covers an entire surface of the second electrode in plan view as viewed along the light incidence direction, and the second electrode preferably covers an entire surface of a first side of the pyroelectric body that is opposite from a second side facing the first electrode.

Through this configuration, the entire surface of the second electrode can be used as a light-reflecting surface, and the light absorption efficiency is improved by causing the light transmitted by the light-absorbing member to return to the light-absorbing member.

In the pyroelectric detector as described above, the light-absorbing member preferably overlaps with the first region of the first electrode and at least a portion of the second region of the first electrode in plan view as viewed along the light incidence direction.

Through this configuration, the volume of the light-absorbing member is increased, the amount of light absorption is increased, and the first electrode can also be used as a light-reflecting surface. The light absorption efficiency can also be further improved by causing the light transmitted by the light-absorbing member to return to the light-absorbing member.

In the pyroelectric detector as described above, the first electrode wiring layer preferably includes a first connecting part connected to the first plug, and a first lead wiring part extending from the first connecting part and having a width smaller than a width of the first connecting part, the second electrode wiring layer preferably includes a second connecting part connected to the second plug, and a second lead wiring part extending from the second connecting part and having a width smaller than a width of the second connecting part, and the width of the second lead wiring part is preferably less than a maximum length in a transverse-cross section of the second contact hole.

Through this configuration, the thermal resistance of the second lead wiring part is increased, the thermal separation properties of the pyroelectric detection element are enhanced, the amount of light reflected by the second lead wiring part is reduced, the amount of light reflected by the second electrode can be increased, and the light absorption efficiency increases.

In the pyroelectric detector as described above, the width of the first lead wiring part is preferably less than the maximum length in a transverse cross-section of the first contact hole.

Through this configuration, the thermal resistance of the first lead wiring part is increased, the thermal separation properties of the pyroelectric detection element are enhanced, the amount of light reflected by the first lead wiring part is reduced, the amount of light reflected by the first electrode can be increased, and the light absorption efficiency increases.

In the pyroelectric detector as described above, a reducing gas barrier layer is preferably further provided between the interlayer insulation layer and the capacitor.

The characteristics of the capacitor degrade when oxygen deficit occurs due to reducing gas during manufacturing or use of the capacitor, but the capacitor can be protected by the reducing gas barrier layer.

A pyroelectric detection device according to another aspect of the present invention includes a plurality of the pyroelectric detectors described above, arranged in two dimensions along two axes. In this pyroelectric detection device, the detection sensitivity is increased in the pyroelectric detector of each cell, and a distinct light (temperature) distribution image can therefore be provided.

An electronic instrument according to another aspect of the present invention has the pyroelectric detector or the pyroelectric detection device described above. By using one or a plurality of cells of the pyroelectric detector as a sensor, the electronic instrument is most suitable in thermography for outputting a light (temperature) distribution image, in automobile navigation or surveillance cameras as well as object analysis instruments (measurement instruments) for analyzing (measuring) physical information of objects, in security instruments for detecting fire or heat, in FA (Factory Automation) instruments provided in factories or the like, and in other applications. The pyroelectric detector or pyroelectric detection device, or the electronic instrument having the pyroelectric detector or pyroelectric detection device, may also be applied in a flow sensor or the like for detecting the flow rate of a liquid under conditions in which an amount of supplied heat and an amount of heat taken in by the fluid are in equilibrium. The pyroelectric detector or pyroelectric detection device of the present invention may be provided in place of a thermocouple or the like provided to the flow sensor, and a subject other than light may be detected.

BRIEF DESCRIPTION OF THE DRAWINGS

Referring now to the attached drawings which form a part of this original disclosure.

DETAILED DESCRIPTION OF EXEMPLARY EMBODIMENTS

1. Pyroelectric Infrared Detection Device

Figure 1:
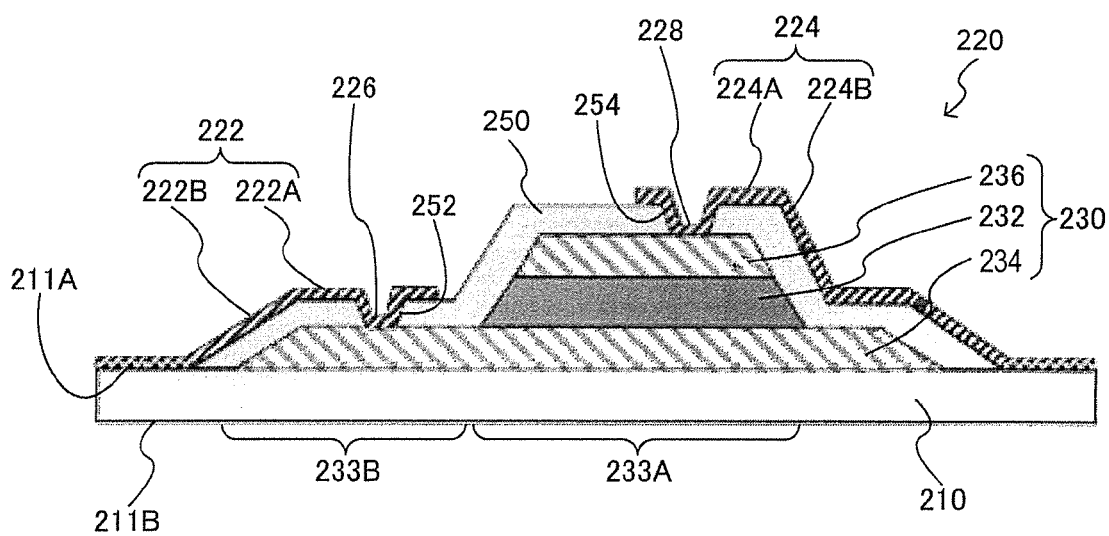
FIG. 1 is a simplified sectional view showing the planar-type capacitor according to an embodiment of the present invention.
Figure 2:
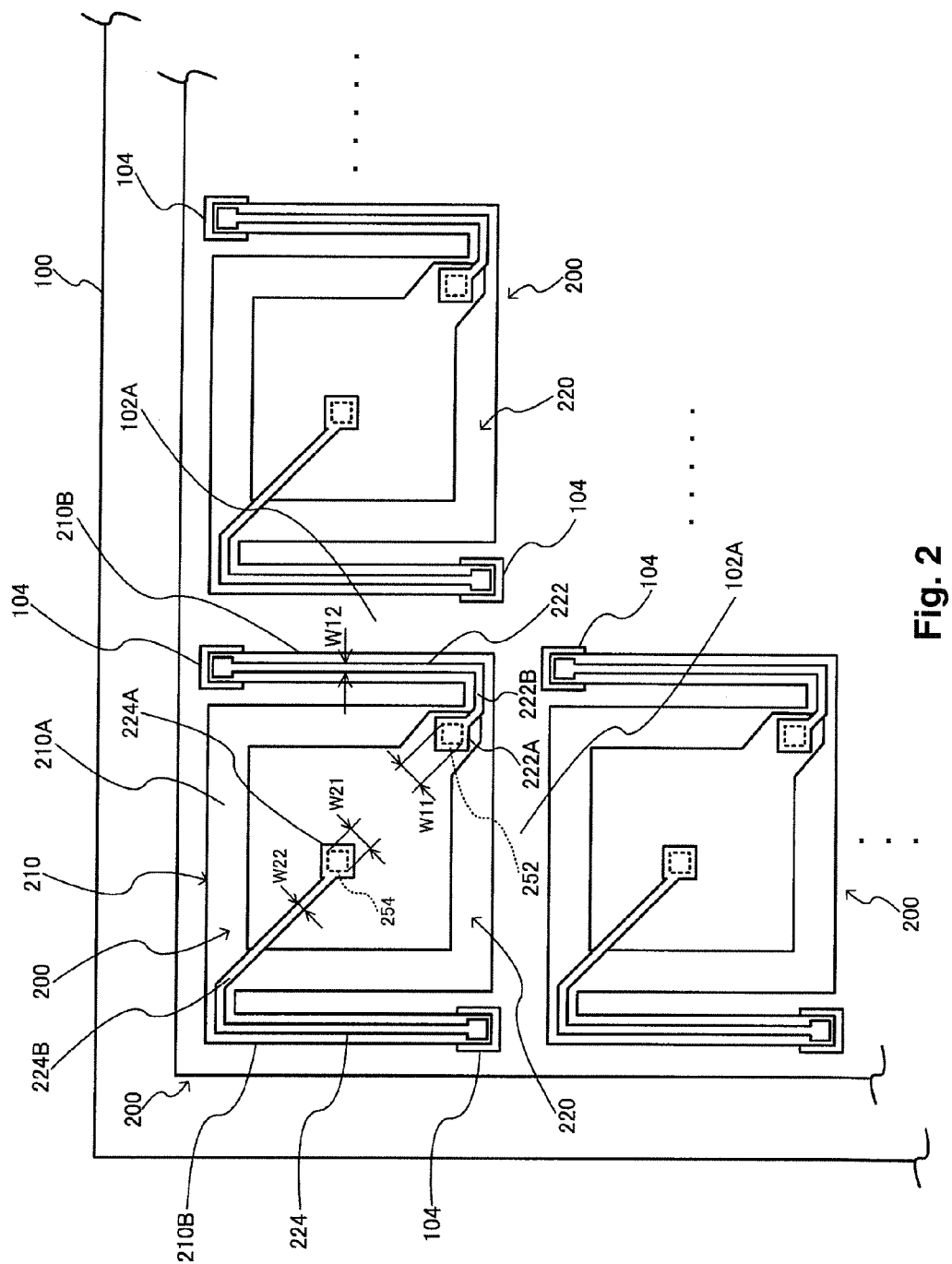
FIG. 2 is a simplified plan view showing the pyroelectric infrared detection device according to an embodiment of the present invention.

FIG. 2 shows a pyroelectric infrared detection device (one example of a pyroelectric detection device) in which a plurality of cells of pyroelectric infrared detectors 200 is arranged along two orthogonal axes, each cell being provided with a support member 210 and a pyroelectric detection element 220 mounted on the support member 210 shown in FIG. 1. A pyroelectric infrared detection device may also be formed by a pyroelectric infrared detector of a single cell. In FIG. 2, a plurality of posts 104 is provided upright from a base part (also referred to as a fixing part) 100, and pyroelectric infrared detectors 200, each cell of which is supported by two posts 104, for example, are arranged along two orthogonal axes. The area occupied by each cell of pyroelectric infrared detectors 200 is 30×30 µm, for example.

As shown in FIG. 2, each pyroelectric infrared detector 200 includes a support member (membrane) 210 linked to two posts (support parts) 104, and an infrared detection element (one example of a pyroelectric detection element) 220. The area occupied by the pyroelectric infrared detection element 220 of one cell is 10×10 µm, for example.

Besides being connected to the two posts 104, the pyroelectric infrared detector 200 of each cell is in a non-contacting state, a cavity 102 (see FIG. 2) is formed below the pyroelectric infrared detector 200, and open parts 102A communicated with the cavity 102 are provided on the periphery of the pyroelectric infrared detector 200 in plan view. The pyroelectric infrared detector 200 of each cell is thereby thermally separated from the base part 100 as well as from the pyroelectric infrared detectors 200 of other cells.

The support member 210 has a mounting part 210A for mounting and supporting the infrared detection element 220, and two arms 210B linked to the mounting part 210A, and free end parts of the two arms 210B are linked to the posts 104. The two arms 210B are formed so as to extend redundantly and with a narrow width in order to thermally separate the pyroelectric infrared detection element 220.

FIG. 2 is a plan view which omits the members above the wiring layers connected to the upper electrodes, and FIG. 2 shows a first electrode (lower electrode) wiring layer 222 and a second electrode (upper electrode) wiring layer 224 connected to the pyroelectric infrared detection element 220. The first and second electrode wiring layers 222, 224 extend along the arms 210B, and are connected to a circuit inside the base part 100 via the posts 104. The first and second electrode wiring layers 222, 224 are also formed so as to extend redundantly and with a narrow width in order to thermally separate the pyroelectric infrared detection element 220.

2. Planar-Type Capacitor and Stack-Type Capacitor 2.1 Planar-Type Capacitor

Figure 10:
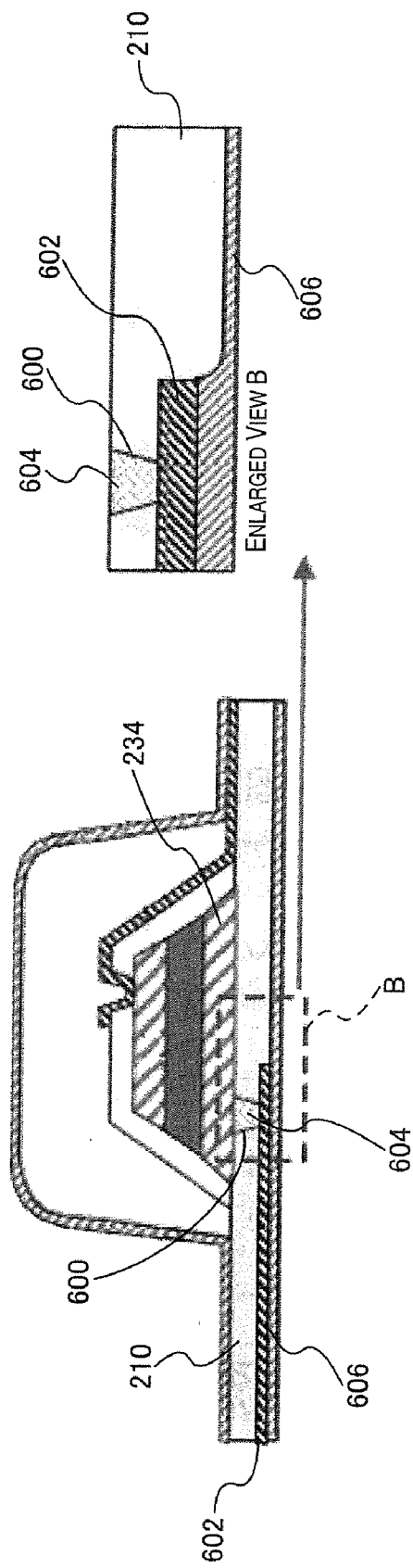
FIG. 10 is a sectional view showing an example of a stack-type capacitor as a comparative example.
Figure 11:
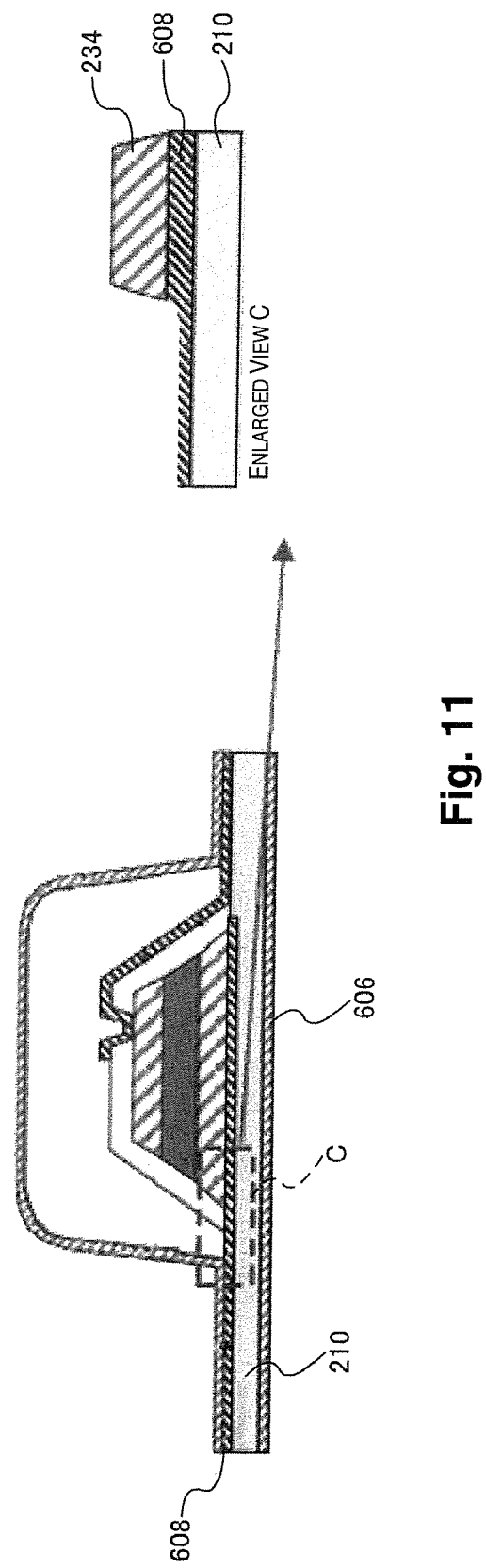
FIG. 11 is a sectional view showing another example of a stack-type capacitor as a comparative example.

FIG. 1 shows a planar-type capacitor 230 used in the pyroelectric infrared detector of the present embodiment. Stack-type capacitors are shown in FIGS. 10 and 11 as comparative examples.

In FIG. 1, the pyroelectric infrared detector includes the pyroelectric infrared detection element 220 and the support member 210. The support member 210 includes a first surface 211A on a first side and a second surface 211B on a second side which is opposite from the first surface 211A, with the pyroelectric infrared detection element 220 being mounted on the first surface 211A. The second surface 211B of the support member 210 faces the cavity 102, and a portion of the support member 210 is supported by the posts (support parts) 104 shown in FIG. 2.

The capacitor 230 of the pyroelectric infrared detection element 220 includes a first electrode (lower electrode) 234, a second electrode (upper electrode) 236, and a pyroelectric body 232 (pyroelectric material) disposed between the first and second electrodes 234, 236, and the infrared detection element 220 has a capacitor 230 in which an amount of polarization changes based on temperature. The first electrode 234 includes a first region 233A in which the pyroelectric body 232 is laminated and formed, and a second region 233B which is formed so as to extend from the first region 233A. The first electrode 234 is mounted on the support member 210, and the capacitor 230 is thereby supported.

An interlayer insulation layer 250 is formed so as to cover the surface of the capacitor 230. A first contact hole 252 is formed in the interlayer insulation layer 250 so as to pass through the second region 233B of the first electrode 234, and a second contact hole 254 is formed so as to pass through the second electrode 236.

A first plug 226 is formed so as to be embedded in the first contact hole 252. A first electrode wiring layer 222 connected to the first plug 226 is formed on the interlayer insulation layer 250 and the support member 210. In the same manner, a second plug 228 is formed so as to be embedded in the second contact hole 254. A second electrode wiring layer 224 connected to the second plug 228 is formed on the interlayer insulation layer 250 and the support member 210.

2.2 Stack-Type Capacitor

Stack-type capacitors for comparison with the planar-type capacitor of the present embodiment are shown in FIGS. 10 and 11. In the stack-type capacitors shown in FIGS. 10 and 11, the wiring structure with respect to the first electrode (lower electrode) 234 differs from that of the planar-type capacitor shown in FIG. 1.

In FIG. 10, a contact hole 600 opening in the first surface 211A of the support member 210 is formed, a first electrode wiring layer 602 is formed inside the layer of the support member 210, and the first electrode 234 and the first electrode wiring layer 602 are connected by a plug 604 which is filled into the contact hole 600.

In this case, the first electrode wiring layer 602 is formed on an etching protection layer 606 (omitted in FIG. 1) formed on a lower surface of the support member 210, and the support member 210 is subsequently laminated. As described in detail hereinafter, the etching protection layer 606 is a layer for protecting the support member 210 from the etchant when the sacrificial layer is isotropically etched to form the cavity 102 after the support member 210 and other components laminated on the sacrificial layer are formed.

After the first electrode wiring layer 602 is formed on the etching protection layer 606, the first electrode wiring layer 602 is etched for patterning. At this time, the etching protection layer 606 is etched together with the first electrode wiring layer 602, and a portion having a small layer thickness is formed, as shown in a partial enlarged view B of FIG. 10. In the partial enlarged view B in FIG. 10, only the support member 210, the first electrode wiring layer 602 and the etching protection layer 606 are shown for the sake of brevity. The protective layer capability of the etching protection layer 606 decreases as the thickness thereof decreases. When the etching protection layer 606 is formed so as to have a large thickness in advance out of consideration for this thin-film phenomenon, heat from the infrared detection element 220 readily diffuses via the etching protection layer 606, and the thermal separation characteristics of the infrared detection element 220 are degraded.

On the other hand, in the stack-type capacitor shown in FIG. 11, a first electrode wiring layer 608 which touches the first electrode 234 is formed on the uppermost layer of the support member 210. At this time, after the first electrode wiring layer 608 is formed on the entire surface of the support member 210, the first electrode wiring layer 608 is patterned. In this state, a level difference occurs, and after the support member 210 is additionally laminated, the surface of the support member 210 is smoothed so as to be flush with the first electrode wiring layer 608. The first electrode 234, the pyroelectric body 232, and the second electrode 236 are subsequently laminated, and then patterned to form the shape of the capacitor 230. During patterning of the capacitor 230, the first electrode wiring layer 608 in the region other than the region directly below the first electrode 234 is etched so that the layer thickness thereof is reduced, as shown in a partial enlarged view C of FIG. 11, or a disconnection occurs. In the partial enlarged view C in FIG. 11, only the support member 210, the first electrode wiring layer 608 and the first electrode 234 are shown for the sake of brevity. Considering this phenomenon, even when the first electrode wiring layer 608 is formed so as to have a large thickness, since the layer thickness of the first electrode wiring layer 608 fluctuates due to etching, and the thermal separation characteristics also fluctuate, the sensor characteristics are degraded.

2.3 Problems of Thermally Separated Pyroelectric Detector and Measures for Solving the Problems From the perspective of the sensor characteristics of a thermally separated infrared detection element as described above, a planar-type capacitor is superior to a stack-type capacitor. However, the functioning of the first and second electrode wiring layers as thermal conduction paths is a problem common to both a planar-type capacitor and a stack-type capacitor.

In other words, although the first and second electrode wiring layers 222, 224 are indispensible for driving the pyroelectric capacitor 230, the heat of the capacitor 230 is radiated from the first and second electrode wiring layers 222, 224.

Therefore, in the present embodiment, a configuration is adopted in which the thermal conductivity of the material for forming the first and second electrode wiring layers 222, 224 is lower than the thermal conductivity of the material (single-layer electrode material in the case of single-layer electrodes, and the electrode material of the uppermost layer in the case of multi-layer electrodes) for forming the first and second electrodes 234, 236 in the portions connected to the first and second plugs 226, 228.

The thermal conductivity of the material of the first and second electrodes 234, 236 is 71.6 W/m·K in the case of platinum (Pt), and 147 W/m·K in the case of iridium (Ir), for example. On the other hand, the thermal conductivity of the common wiring materials aluminum (Al) and copper (Cu) is 237 W/m·K and 403 W/m·K, respectively, which is usually higher than that of the first and second electrodes 234, 236.

In the present embodiment, the first and second electrode wiring layers 222, 224 are formed of titanium nitride (TiN) or titanium aluminum nitride (TiAlN), for example, as materials having lower thermal conductivity than platinum (Pt) or iridium (Ir), for example, which are metal materials preferred as the electrode material of the first and second electrodes 234, 236. The thermal conductivity of titanium nitride (TiN), for example, is 29 W/m·K, and the thermal conductivity of titanium aluminum nitride (TiAlN) is 5 to 10 W/m·K, which is adequately lower than the thermal conductivity of platinum (Pt) or iridium (Ir), for example, which are the metal materials preferred as the electrode material of the first and second electrodes 234, 236.

Through this configuration, it is possible to suppress the radiation of heat of the pyroelectric body 232 via the first and second electrode wiring layers 222, 224, which are indispensible for driving the capacitor 230, and the thermal separation properties of the infrared detection element 220 are enhanced.

As described above, the infrared-absorbing body is disposed above the capacitor 230, and the heat due to infrared irradiation is transferred to the pyroelectric body 232 from the infrared-absorbing body. Since the second electrode (upper electrode) 236 is present in this thermal conduction path, the suppression of radiation from the second electrode wiring layer 224 connected to the second electrode 236 contributes to increasing the efficiency of heat transfer from the infrared-absorbing body to the pyroelectric body 232. The thermal separation properties of the infrared detection element 220 can thus be enhanced by merely reducing the thermal conductivity of the second electrode wiring layer 224 to a value below that of the second electrode 236.

In particular, as described hereinafter, in a case in which the second electrode (upper electrode) 236 is provided with a thermal conductance greater than the thermal conductance of the first electrode (lower electrode) 234 in order to increase the efficiency of thermal transfer from the infrared-absorbing body to the pyroelectric body 232, the thermal separation properties of the pyroelectric infrared detection element 220 can be effectively enhanced by merely reducing the thermal conductivity of the second electrode wiring layer 224 to a value below that of the second electrode 236. However, by furthermore reducing the thermal conductivity of the first electrode wiring layer 222 to a value below that of the first electrode 234, the radiation of the heat of the pyroelectric body 232 via the first electrode 234 and the first electrode wiring layer 222 is further reduced, and the thermal separation properties of the pyroelectric infrared detection element 220 are therefore further enhanced.

The first electrode wiring layer 222 herein may include a first connecting part 222A connected to the first plug 226, and a first lead wiring part 222B extending from the first connecting part 222A and having a smaller width than the first connecting part 222A, as shown in FIGS. 1 and 2. In the same manner, the second electrode wiring layer 224 may include a second connecting part 224A connected to the second plug 228, and a second lead wiring part 224B extending from the second connecting part 224A and having a smaller width than the second connecting part 224A.

In the present embodiment, the width W22 of the second lead wiring part 224B is less than the maximum length W21 of a transverse section of the second contact hole 254, as shown in FIG. 2. The maximum length W21 of the transverse section of the second contact hole 254 is the length of a diagonal when the outline of the contact hole is rectangular, and is the diameter when the outline of the contact hole is circular. In the present embodiment, since there is no need for the infrared-absorbing layer to be disposed in the second contact hole 254, in contrast with the technique of Japanese Laid-Open Patent Application Publication No. 2008-232896, the size of the second contact hole 254 can be set to the minimum value for the design. Since the width W22 of the second lead wiring part 224B is less than the maximum length W21 of the transverse section of the second contact hole 254, the thermal transfer characteristics can be reduced in proportion to the sectional area. The thermal separation properties of the infrared detection element 220 can be enhanced by this means as well.

In addition to the configuration described above, the width W12 of the first lead wiring part 222B may be less than the maximum length W11 of a transverse section of the first contact hole 252, as shown in FIG. 2. Through this configuration, the thermal transfer characteristics of the first lead wiring part 222B are also reduced, and the thermal separation properties of the infrared detection element 220 can therefore be further enhanced.

Another point of technical significance of reducing the widths W12, W22 of the first and second lead wiring parts 222B, 224B is that the efficiency of absorption by the infrared-absorbing layer is enhanced. This point will be described hereinafter.

3. Overview of Pyroelectric Infrared Detector

Figure 3:
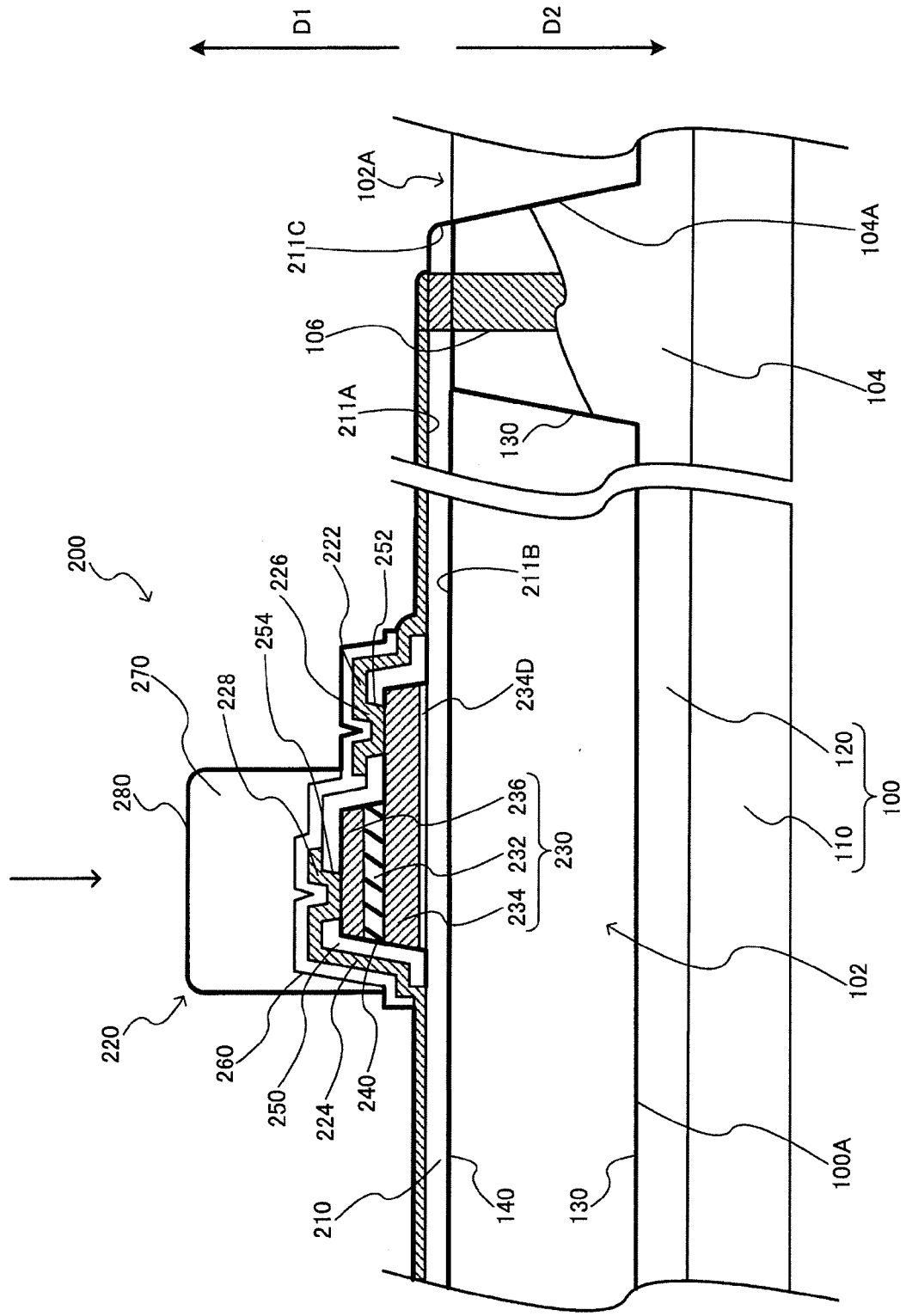
FIG. 3 is a simplified sectional view showing the pyroelectric detector of one cell of the pyroelectric infrared detection device according to an embodiment of the present invention.
Figure 4:
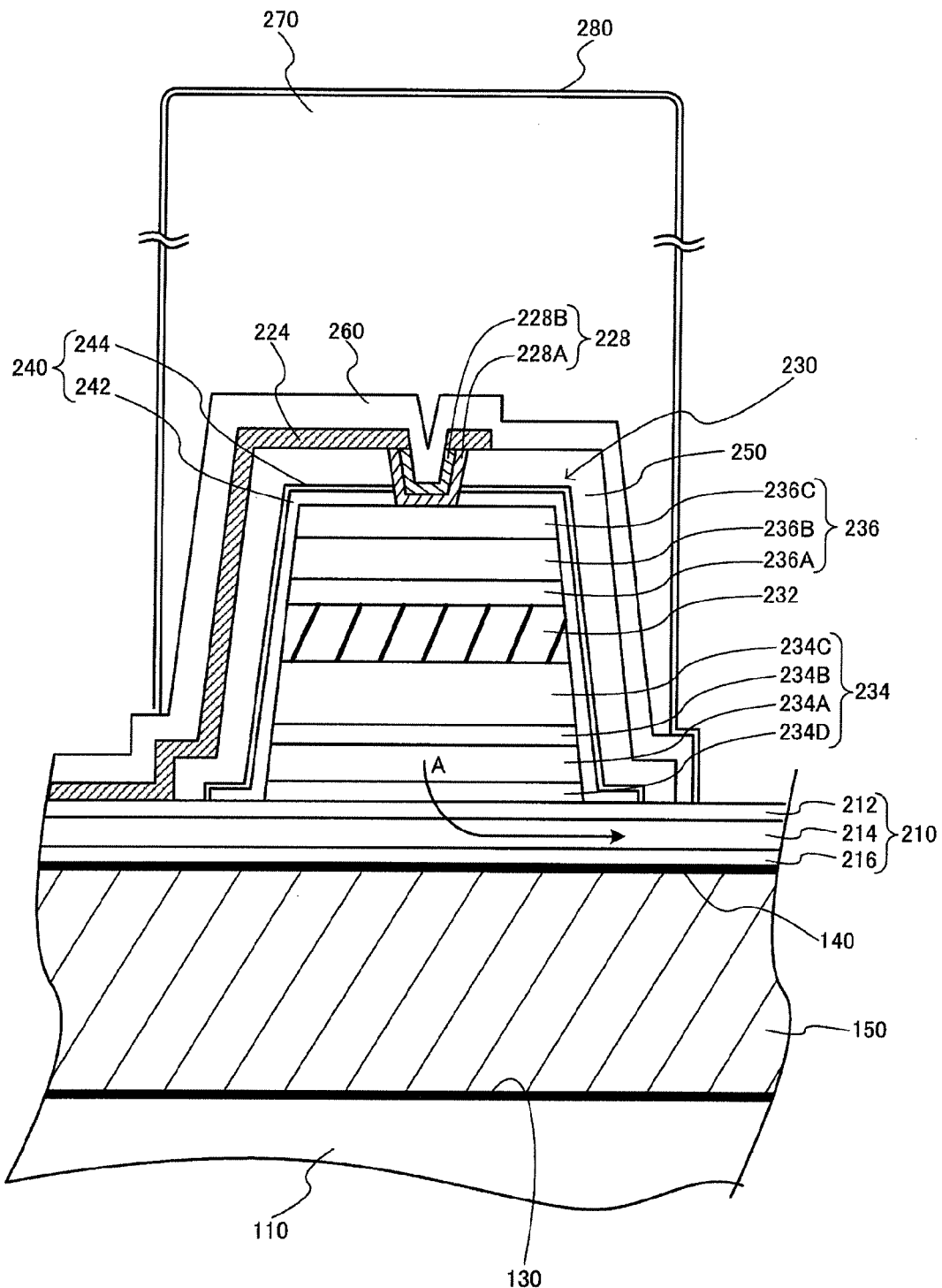
FIG. 4 is a simplified sectional view showing a manufacturing step, and shows the support member and infrared detection element formed on the sacrificial layer.

FIG. 3 is a sectional view showing the entire pyroelectric infrared detector 200 shown in FIG. 2. FIG. 3 schematically shows cross-sectional views in two different parts of the pyroelectric infrared detector 200 with one part being a cross-sectional view taken along a vertical plane passing through both the first contact hole 252 and the second contact hole 254, and the other part being a cross-sectional view taken along a vertical plane passing through the post 104. FIG. 4 is a partial sectional view showing the pyroelectric infrared detector 200 during the manufacturing process. In FIG. 4, the cavity 102 shown in FIG. 3 is embedded by a sacrificial layer 150. The sacrificial layer 150 is present from before the step of forming the support member 210 and the pyroelectric infrared detection element 220 until after this formation step, and is removed by isotropic etching after the step of forming the pyroelectric infrared detection element 220.

As shown in FIG. 3, the base part 100 includes a substrate, e.g., a silicon substrate 110, and a spacer layer 120 formed by an insulation layer (e.g., $SiO_2$) on the silicon substrate 110. The post (support part) 104 is formed by etching the spacer layer 120, and is formed of $SiO_2$, for example. A plug 106 connected to one of the first and second electrode wiring layers 222, 224 may be disposed at the post (support part) 104. The plug 106 is connected to a row selection circuit (row driver) provided on the silicon substrate 110, or a read circuit for reading data from a detector via a column line. The cavity 102 is formed at the same time as the post 104 by etching the spacer layer 120. The open parts 102A shown in FIG. 2 are formed by pattern etching the support member 210.

The pyroelectric infrared detection element 220 mounted on the first surface 211A of the support member 210 includes a capacitor 230. The capacitor 230 includes a pyroelectric body 232, a first electrode (lower electrode) 234 connected to the lower surface of the pyroelectric body 232, and a second electrode (upper electrode) 236 connected to the upper surface of the pyroelectric body 232. The first electrode 234 may include an adhesive layer 234D for increasing adhesion to a first layer member (e.g., $SiO_2$ support layer) 212 of the support member 210 (see FIG. 4).

The capacitor 230 is covered by a reducing gas barrier layer 240 for suppressing penetration of reducing gas (hydrogen, water vapor, OH groups, methyl groups, and the like) into the capacitor 230 during steps after formation of the capacitor 230. The reason for providing the reducing gas barrier layer 240 is that the pyroelectric body (e.g., PZT or the like) 232 of the capacitor 230 is an oxide, and when an oxide is reduced, oxygen deficit occurs and the pyroelectric effects are compromised.

The reducing gas barrier layer 240 includes a first barrier layer 242 and a second barrier layer 244, as shown in FIG. 4. The first barrier layer 242 can be formed by forming a layer of a metal oxide, e.g., aluminum oxide $Al_2O_3$, by sputtering. Since reducing gas is not used in sputtering, no reduction of the capacitor 230 occurs. The second barrier layer 244 can be formed by forming a layer of aluminum oxide $Al_2O_3$, for example, by Atomic Layer Chemical Vapor Deposition (AL-CVD), for example. Common CVD (Chemical Vapor Deposition) methods use reducing gas, but the capacitor 230 is isolated from the reducing gas by the first barrier layer 242.

The total layer thickness of the reducing gas barrier layer 240 herein is 50 to 70 nm, e.g., 60 nm. At this time, the layer thickness of the first barrier layer 242 formed by CVD is greater than that of the second barrier layer 244 formed by Atomic Layer Chemical Vapor Deposition (ALCVD), and is 35 to 65 nm, e.g., 40 nm, at minimum. In contrast, the layer thickness of the second barrier layer 244 formed by Atomic Layer Chemical Vapor Deposition (ALCVD) can be reduced; for example, a layer of aluminum oxide $Al_2O_3$ is formed having a thickness of 5 to 30 nm, e.g., 20 nm. Atomic Layer Chemical Vapor Deposition (ALCVD) has excellent embedding characteristics in comparison with sputtering and other methods, and can therefore be adapted for miniaturization, and the reducing gas barrier properties can be increased by the first and second barrier layers 242, 244. The first barrier layer 242 formed by sputtering is not precise in comparison with the second barrier layer 244, but this aspect contributes to lowering the heat transfer rate thereof, and dissipation of heat from the capacitor 230 can therefore be prevented.

An interlayer insulation layer 250 is formed on the reducing gas barrier layer 240. Hydrogen gas, water vapor, or other reducing gas usually is formed when the starting material gas (TEOS) of the interlayer insulation layer 250 chemically reacts. The reducing gas barrier layer 240 provided on the periphery of the capacitor 230 protects the capacitor 230 from the reducing gas that occurs during formation of the interlayer insulation layer 250.

The first electrode (lower electrode) wiring layer 222 and second electrode (upper electrode) wiring layer 224 shown in FIGS. 1 and 2 as well are disposed on the interlayer insulation layer 250. A first contact hole 252 and second contact hole 254 are formed in advance in the interlayer insulation layer 250 before formation of the electrode wiring. At this time, a contact hole is formed in the same manner in the reducing gas barrier layer 240 as well. The first electrode (lower electrode) 234 and the first electrode wiring layer 222 are made continuous by a first plug 226 embedded in the first contact hole 252. The second electrode (upper electrode) 236 and the second electrode wiring layer 224 are made continuous in the same manner by a second plug 228 embedded in the second contact hole 254.

When the interlayer insulation layer 250 is not present in this arrangement, during pattern etching of the first electrode (lower electrode) wiring layer 222 and the second electrode (upper electrode) wiring layer 224, the second barrier layer 244 of the reducing gas barrier layer 240 beneath is etched, and the barrier properties thereof are reduced. The interlayer insulation layer 250 is necessary for ensuring the barrier properties of the first reducing gas barrier layer 240.

The interlayer insulation layer 250 preferably has a low hydrogen content. The interlayer insulation layer 250 is therefore degassed by annealing. The hydrogen content of the interlayer insulation layer 250 is thereby made lower than that of a passivation layer 260 for covering the first and second electrode wiring layers 222, 224.

Figure 5:
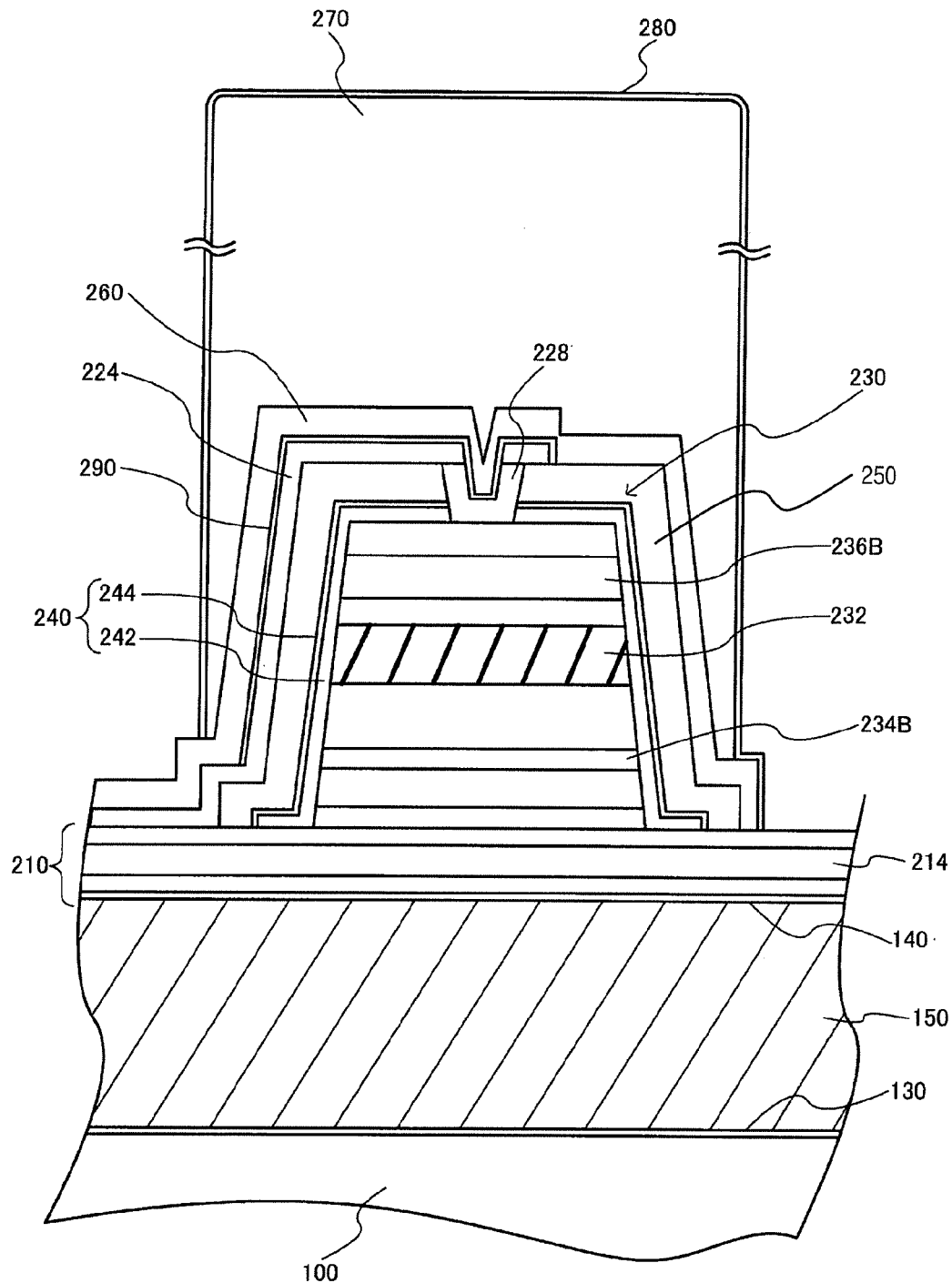
FIG. 5 is a simplified sectional view showing a modification in which the reducing gas barrier properties in the vicinity of the wiring plug are enhanced.

Since the reducing gas barrier layer 240 at the top of the capacitor 230 is devoid of contact holes and closed when the interlayer insulation layer 250 is formed, the reducing gas during formation of the interlayer insulation layer 250 does not penetrate into the capacitor 230. However, the barrier properties decline after the contact hole is formed in the reducing gas barrier layer 240. As an example of a technique for preventing this phenomenon, the first and second plugs 226, 228 are formed by a plurality of layers 228A, 228B (only the second plug 228 is shown in FIG. 4), as shown in FIG. 4, and a barrier metal layer is used in the first layer 228A. Reducing gas barrier properties are ensured by the barrier metal of the first layer 228A. Highly diffusible metals such as titanium Ti are not preferred as the barrier metal of the first layer 228A, and titanium aluminum nitride TiAlN, which has minimal diffusibility and high reducing gas barrier properties, can be used. A reducing gas barrier layer 290 may be additionally provided so as to surround at least the second plug 228 as shown in FIG. 5, as a method for stopping the penetration of reducing gas from the contact hole. This reducing gas barrier layer 290 may also serve as the barrier metal 228A of the second plug 228, or the barrier metal 228A may be removed. The reducing gas barrier layer 290 may also coat the first plug 226.

The $SiO_2$ or SiN passivation layer 260 is provided so as to cover the first and second electrode wiring layers 222, 224. An infrared-absorbing body (one example of a light-absorbing member) 270 is provided on the passivation layer 260 above at least the capacitor 230. The passivation layer 260 is also formed of $SiO_2$ or SiN, but is preferably formed of a different type of material which has a high etching selection ratio with respect to the passivation layer 260 below, due to the need for pattern etching of the infrared-absorbing body 270. Infrared rays are incident on the infrared-absorbing body 270 from the direction of the arrow in FIG. 3, and the infrared-absorbing body 270 evolves heat in accordance with the amount of infrared rays absorbed. Thus, the light incident direction is defined as a direction generally perpendicular to the support member 210 as shown by the arrow in FIG. 3. This heat is transmitted to the pyroelectric body 232, whereby the amount of spontaneous polarization of the capacitor 230 varies according to the heat, and the infrared rays can be detected by detecting the charge due to the spontaneous polarization.

Even when reducing gas is generated during CVD formation of the passivation layer 260 or the infrared-absorbing body 270, the capacitor 230 is protected by the first reducing gas barrier layer 240 and the barrier metals in the first and second plugs 226, 228.

A reducing gas barrier layer 280 is provided so as to cover the external surface of the infrared detector 200 which includes the infrared-absorbing body 270. The reducing gas barrier layer 280 must be formed with a smaller thickness than the reducing gas barrier layer 240, for example, in order to increase the transmittance of infrared rays (in the wavelength spectrum of 8 to 14 μm) incident on the infrared-absorbing body 270. For this purpose, Atomic Layer Chemical Vapor Deposition (ALCVD) is used, which is capable of adjusting the layer thickness at a level corresponding to the size of an atom. The reason for this is that the layer formed by a common CVD method is too thick, and infrared transmittance is adversely affected. In the present embodiment, a layer of aluminum oxide $Al_2O_3$, for example, is formed having a thickness of 10 to 50 nm, e.g., 20 nm. As described above, Atomic Layer Chemical Vapor Deposition (ALCVD) has excellent embedding characteristics in comparison with sputtering and other methods, and is therefore adapted to miniaturization, a precise layer can be formed at the atomic level, and reducing gas barrier properties can be increased even in a thin layer.

On the side of the base part 100, an etching stop layer 130 for use during isotropic etching of the sacrificial layer 150 (see FIG. 4) embedded in the cavity 102 in the process of manufacturing the pyroelectric infrared detector 200 is formed on a wall part for defining the cavity 102, i.e., a side wall 104A and a bottom wall 110A for defining the cavity. An etching stop layer 140 is formed in the same manner on a lower surface (upper surface of the sacrificial layer 150) of the support member 210. In the present embodiment, the reducing gas barrier layer 280 is formed of the same material as the etching stop layers 130, 140. In other words, the etching stop layers 130, 140 also have reducing gas barrier properties. The etching stop layers 130, 140 are also formed by forming layers of aluminum oxide $Al_2O_3$ at a thickness of 20 to 50 nm by Atomic Layer Chemical Vapor Deposition (ALCVD).

Since the etching stop layer 130 has reducing gas barrier properties, when the sacrificial layer 150 is isotropically etched by hydrofluoric acid in a reductive atmosphere, it is possible to keep the reducing gas from passing through the support member 210 and penetrating into the capacitor 230. Since the etching stop layer 140 for covering the base part 100 has reducing gas barrier properties, it is possible to keep the transistors or wiring of the circuit in the base part 100 from being reduced and degraded.

4. Structure of Support Member

As shown in FIG. 3, the support part 104, the support member 210, and the infrared detection element 220 are laminated on the base part 100 in a first direction D1 from the bottom layer to the top layer. The support member 210 mounts the infrared detection element 220 via the adhesive layer 234D on the side of the first surface 211A, and the side of the second surface 211B faces the cavity 102. The adhesive layer 234D constitutes a portion (bottom layer) of the infrared detection element 220.

As shown in FIG. 5, the support member 210 has the first layer member 212 on the side of the first surface adjacent to at least the adhesive layer 234D as an insulation layer, e.g., a $SiO_2$ support layer. The $SiO_2$ support layer (first layer member) 212 has a smaller hydrogen content than the post (support part) 104, for example, which is another $SiO_2$ layer positioned further in a second direction D2 than the $SiO_2$ support layer (first layer member) 212, where the second direction D2 is the opposite direction from the first direction D1 shown in FIG. 3. This is accomplished by reducing the content of hydrogen or moisture in the layer by increasing the $O_2$ flow rate during CVD layer formation to an amount greater than that used during normal CVD for an interlayer insulation layer. The $SiO_2$ support layer (first layer member) 212 is thereby provided with a lower moisture content than the post (support part) 104, for example, which is an $SiO_2$ layer having a different hydrogen content.

When the moisture content is small in the $SiO_2$ support layer (first layer member) 212 which is the uppermost layer of the support member 210 adjacent to the adhesive layer 234D, reducing gas (hydrogen, water vapor) can be prevented from forming from the $SiO_2$ support layer (first layer member) 212 as such even when the $SiO_2$ support layer is exposed to high temperatures by heat treatment after formation of the pyroelectric body 232. Reductive species can thus be prevented from penetrating into the pyroelectric body 232 of the capacitor 230 from directly below (on the side of the support member 210) the capacitor 230, and oxygen deficit in the pyroelectric body 232 can be suppressed.

Reductive species can also form from moisture of the post (support part) 104, for example, as another $SiO_2$ layer positioned further in the second direction D2 than the $SiO_2$ support layer (first layer member) 212, but because the post (support part) 104 is separated from the capacitor 230, the effect thereof is less than that of the $SiO_2$ support layer (first layer member) 212. However, since reductive species can also form from moisture of the post (support part) 104, a layer having reducing gas barrier properties is preferably formed in advance in the support member 210 positioned further in the second direction D2 than the $SiO_2$ support layer (first layer member) 212. This aspect is described below in the more specific description of the structure of the support member 210.

The support member 210 may be formed by laminating the $SiO_2$ support layer (first layer member) 212, a middle layer (second layer member) 214, and another $SiO_2$ layer (third layer member) 216 as shown in FIG. 4, in the second direction D2 shown in FIG. 3.

In other words, in the present embodiment, the support member 210, in which curvature occurs when a single material is used, is formed by laminating a plurality of different types of materials. Specifically, the first and third layer members 212, 216 may be formed of oxide layers ($SiO_2$), and the second layer member 214 as the middle layer may be formed of a nitride layer (e.g., $Si_3N_4$).

The residual compression stress, for example, that occurs in the first layer member 212 and third layer member 216, for example, and the residual tensile stress that occurs in the second layer member 214 are directed so as to cancel each other out. The residual stress in the support member 210 as a whole can thereby be further reduced or eliminated. In particular, the strong residual stress of the nitride layer of the second layer member 214 is cancelled out by the oppositely directed residual stress of two layers of oxide layers above and below which constitute the first and third layer members 212, 216, and it is possible to reduce stress that causes curvature in the support member 210. Curvature-reducing effects are obtained even when the support member 210 is formed by two layers which include an oxide layer ($SiO_2$) adjacent to the adhesive layer 234D, and a nitride layer (e.g., $Si_3N_4$). Since curvature can be prevented by forming the support member 210 by the method disclosed in Japanese Patent Application Publication No. 2010-109035, for example, the support member 210 may not necessarily have a laminate structure, and may be formed by an $SiO_2$ layer or other single insulation layer, for example.

The nitride layer (e.g., $Si_3N_4$) for forming the second layer member 214 has reducing gas barrier properties. The support member 210 can thereby also be provided with the function of blocking reductive obstructive factors from penetrating from the side of the support member 210 to the pyroelectric body 232 of the capacitor 230. The penetration of reductive species (hydrogen, water vapor) in the third layer member 216 into the pyroelectric body 232 can therefore be suppressed by the second layer member 214 having reducing gas barrier properties, even when the third layer member 216 positioned further in the second direction D2 of FIG. 3 than the second layer member 214 is another $SiO_2$ layer having a greater hydrogen content than the $SiO_2$ support layer (first layer member) 212.

5. Structure of Capacitor

5.1 Thermal Conductance

Figure 6:
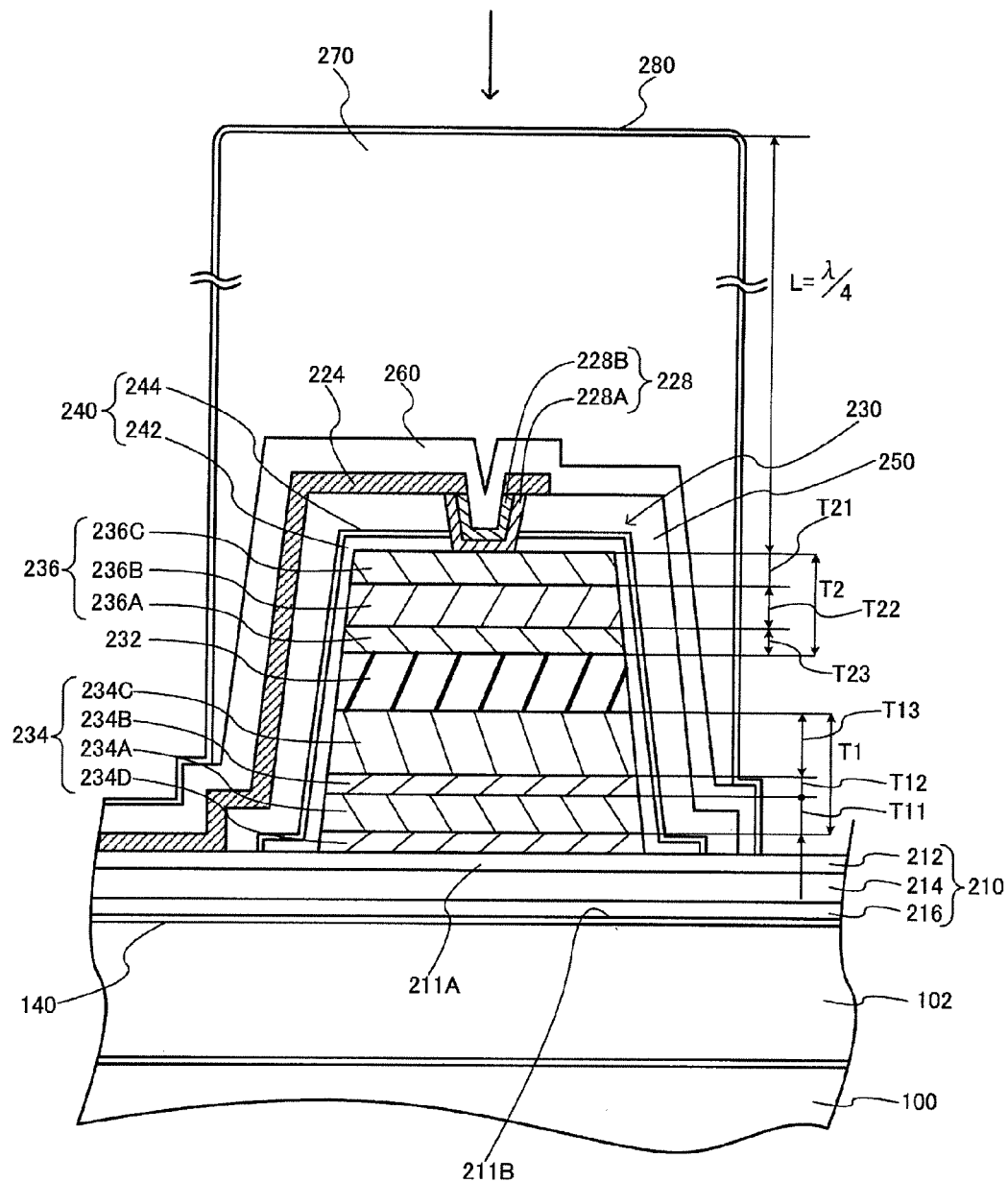
FIG. 6 is a simplified sectional view showing the capacitor structure of the pyroelectric infrared detector.

FIG. 6 is a simplified sectional view showing the relevant parts of the present embodiment. As described above, the capacitor 230 includes a pyroelectric body 232 between the first electrode (lower electrode) 234 and the second electrode (upper electrode) 236. In the capacitor 230, infrared rays can be detected by utilizing a change (pyroelectric effect or pyroelectronic effect) in the amount of spontaneous polarization of the pyroelectric body 232 according to the light intensity (temperature) of the incident infrared rays. In the present embodiment, the incident infrared rays are absorbed by the infrared-absorbing body 270, heat is evolved by the infrared-absorbing body 270, and the heat evolved by the infrared-absorbing body 270 is transmitted via a solid heat transfer path between the infrared-absorbing body 270 and the pyroelectric body 232.

In the capacitor 230 of the present embodiment, the thermal conductance G1 of the first electrode (lower electrode) 234 adjacent to the support member 210 is less than the thermal conductance G2 of the second electrode (upper electrode) 236. Through this configuration, the heat caused by the infrared rays is readily transmitted to the pyroelectric body 232 via the second electrode (upper electrode) 236, the heat of the pyroelectric body 232 does not readily escape to the support member 210 via the first electrode (lower electrode) 234, and the signal sensitivity of the infrared detection element 220 is enhanced. Since the thermal conductivity of the second electrode wiring layer 224 electrically connected to the second electrode 236 is low, as described above, the thermal separation properties of the pyroelectric infrared detector 200 are enhanced.

The structure of the capacitor 230 having the characteristics described above will be described in further detail with reference to FIG. 6. First, the thickness T1 of the first electrode (lower electrode) 234 is greater than that of the second electrode (upper electrode) 236 (T1>T2). The thermal conductance G1 of the first electrode (lower electrode) 234 is such that G1=$\lambda$1/T1, where $\lambda$1 is the thermal conductivity of the first electrode (lower electrode) 234. The thermal conductance G2 of the second electrode (upper electrode) 236 is such that G2=$\lambda$2/T2, where $\lambda$2 is the thermal conductivity of the second electrode (upper electrode) 236.

In order to obtain a thermal conductance relationship of G1<G2, when the first and second electrodes 234, 236 are both formed of the same single material, such as platinum Pt or iridium Ir, then $\lambda$1=$\lambda$2, and T1>T2 from FIG. 6. The relationship G1<G2 can therefore be satisfied.

A case in which the first and second electrodes 234, 236 are each formed of the same material will first be considered. In the capacitor 230, in order for the crystal direction of the pyroelectric body 232 to be aligned, it is necessary to align the crystal lattice level of the boundary of the lower layer on which the pyroelectric body 232 is formed with the first electrode 234. In other words, although the first electrode 234 has the function of a crystal seed layer, platinum Pt has strong self-orienting properties and is therefore preferred as the first electrode 234. Iridium Ir is also suitable as a seed layer material.

In the second electrode (upper electrode) 236, the crystal orientations are preferably continuously related from the first electrode 234 through the pyroelectric body 232 and the second electrode 236, without breaking down the crystal properties of the pyroelectric body 232. The second electrode 236 is therefore preferably formed of the same material as the first electrode 234.

When the second electrode 236 is thus formed by the same material, e.g., Pt, Ir, or another metal, as the first electrode 234, the upper surface of the second electrode 236 can be used as a reflective surface. In this case, as shown in FIG. 6, the distance L from the top surface of the infrared-absorbing body 270 to the top surface of the second electrode 236 is preferably $\lambda$/4 (where $\lambda$ is the detection wavelength of infrared rays). Through this configuration, multiple reflection of infrared rays of the detection wavelength $\lambda$ occurs between the top surface of the infrared-absorbing body 270 and the top surface of the second electrode 236, and infrared rays of the detection wavelength $\lambda$ can therefore be efficiently absorbed by the infrared-absorbing body 270.

5.2 Electrode Multilayer Structure

The structure of the capacitor 230 of the present embodiment shown in FIG. 6 will next be described. In the capacitor 230 shown in FIG. 6, the preferred orientation directions of the pyroelectric body 232, the first electrode 234, and the second electrode 236 are aligned with the (111) orientation, for example. Through a preferred orientation in the (111) plane direction, the orientation rate of (111) orientation with respect to other plane directions is controlled to 90% or higher, for example. The (100) orientation or other orientation is more preferred than the (111) orientation in order to increase the pyroelectric coefficient, but the (111) orientation is used so as to make polarization easy to control with respect to the applied field direction. However, the preferred orientation direction is not limited to this configuration.

The first electrode 234 may include, in order from the support member 210, an orientation control layer (e.g., Ir) 234A for controlling the orientation so as to give the first electrode 234 a preferred orientation in the (111) plane, for example, a first reducing gas barrier layer (e.g., IrOx) 234B, and a preferentially-oriented seed layer (e.g., Pt) 234C.

The second electrode 236 may include, in order from the pyroelectric body 232, an orientation alignment layer (e.g., Pt) 236A in which the crystal alignment is aligned with the pyroelectric body 232, a second reducing gas barrier layer (e.g., IrOx) 236B, and a low-resistance layer (e.g., Ir) 236C for lowering the resistance of the bonded surface with the second plug 228 connected to the second electrode 236.

The first and second electrodes 234, 236 of the capacitor 230 are provided with a multilayer structure in the present embodiment so that the infrared detection element 220 is processed with minimal damage and without reducing the capability thereof despite the small heat capacity thereof, the crystal lattice levels are aligned at each boundary, and the pyroelectric body (oxide) 232 is isolated from reducing gas even when the periphery of the capacitor 230 is exposed to a reductive atmosphere during manufacturing or use.

The pyroelectric body 232 is formed by growing a crystal of PZT (lead zirconate titanate: generic name for Pb(Zr, Ti)O$_3$), PZTN (generic name for the substance obtained by adding Nb to PZT), or the like with a preferred orientation in the (111) plane direction, for example. The use of PZTN is preferred, because even a thin layer is not readily reduced, and oxygen deficit can be suppressed. In order to obtain directional crystallization of the pyroelectric body 232, directional crystallization is performed from the stage of forming the first electrode 234 as the layer under the pyroelectric body 232.

The Ir layer 234A for functioning as an orientation control layer is therefore formed on the lower electrode 234 by sputtering. A titanium aluminum nitride (TiAlN) layer or a titanium nitride (TiN) layer, for example, as the adhesive layer 234D may also be formed under the orientation control layer 234A, as shown in FIG. 6. Such a layer is formed so that adhesion can be maintained with the SiO$_2$ of the SiO$_2$ support layer (first layer member) 212, which is the top layer of the support member 210. Titanium (Ti) may also be applied as this type of adhesive layer 234D, but a highly diffusible metal such as titanium (Ti) is not preferred, and titanium aluminum nitride (TiAlN) or titanium nitride (TiN) is preferred due to the minimal diffusibility and high reducing gas barrier properties thereof.

When the first layer member 212 of the support member 210 positioned beneath the adhesive layer 234D is formed of SiO$_2$, the surface roughness Ra of the SiO$_2$ layer on the side of the adhesive layer adjacent to the first electrode is preferably less than 30 nm. The smoothness of the surface of the support member 210 on which the capacitor 230 is mounted can thereby be maintained. When the surface on which the orientation control layer 234A is formed is rough, the irregularities of the rough surface are reflected in the growth of the crystal, and a rough surface is therefore not preferred.

The adhesive layer 234D may have reducing gas barrier properties. Titanium aluminum nitride (TiAlN) or titanium nitride (TiN) have reducing gas barrier properties. Reducing gas can thereby be prevented from penetrating into the capacitor 230 by the adhesive layer 234D which has reducing gas barrier properties, even when reducing gas leaks from the SiO$_2$ support layer of the support member.

The thermal conductivity of the adhesive layer 234D may be made smaller than the thermal conductivity of the metal material for forming the first electrode 234. Through this configuration, the heat of the capacitor 230 does not readily escape to the support member 210 via the adhesive layer 234D, and the signal accuracy based on the temperature change in the pyroelectric body 232 can be increased. As described above, the adhesive layer 234D having good adhesion to the SiO$_2$ support layer 212 can be titanium (Ti) based, the thermal conductivity of 21.9 (W/m·K) for titanium (Ti) is markedly less than the thermal conductivity of 71.6 (W/m·K) for platinum (Pt) or the thermal conductivity of 147 (W/m·K) for iridium (Ir), for example, which are metals suitable for the first electrode 232, and the thermal conductivity of titanium aluminum nitride (TiAlN) or titanium nitride (TiN) as nitrides of titanium further decreases according to the mixture ratio of nitrogen/titanium.

The hydrolysis catalytic activity of the adhesive layer 234D is preferably lower than the hydrolysis catalytic activity of the other materials of the first electrode 234. When the adhesive layer 234D has low hydrolysis catalytic activity for reacting with moisture to form hydrogen, it is possible to suppress the formation of reducing gas by reaction with OH groups or absorbed water on the surface or in the interlayer insulation layer beneath.

In order to isolate the pyroelectric body 232 from reductive obstructive factors from below the capacitor 230, the IrOx layer 234B for functioning as a reducing gas barrier layer in the first electrode 234 is used together with the second layer member (e.g., Si$_3$N$_4$) of the support member 210, and the etching stop layer (e.g., Al$_2$O$_3$) 140 of the support member 210, which exhibit reducing gas barrier properties. The reducing gas used in degassing from the base part 100 during baking or other annealing steps of the pyroelectric body (ceramic) 232, or in the isotropic etching step of the sacrificial layer 150, for example, is a reductive obstructive factor.

Evaporation vapor sometimes forms inside the capacitor 230 in the baking step of the pyroelectric body 232 and during other high-temperature processing, but an escape route for this vapor is maintained by the first layer member 212 of the support member 210. In other words, in order to allow evaporation vapor formed inside the capacitor 230 to escape, it is better to provide gas barrier properties to the second layer member 214 than to provide gas barrier properties to the first layer member 212.

The IrOx layer 234B as such has minimal crystallinity, but the IrOx layer 234B is in a metal-metal oxide relationship with the Ir layer 234A and thus has good compatibility therewith, and can therefore have the same preferred orientation direction as the Ir layer 234A.

The Pt layer 234C for functioning as a seed layer in the first electrode 234 is a seed layer for the preferred orientation of the pyroelectric body 232, and has the (111) orientation. In the present embodiment, the Pt layer 234C has a two-layer structure. The first Pt layer forms the basis of the (111) orientation, microroughness is formed on the surface by the second Pt layer, and the Pt layer 234C thereby functions as a seed layer for preferred orientation of the pyroelectric body 232. The pyroelectric body 232 is in the (111) orientation after the fashion of the seed layer 234C.

In the second electrode 236, since the boundaries of sputtered layers are physically rough, trap sites occur, and there is a risk of degraded characteristics, the lattice alignment is reconstructed on the crystal level so that the crystal orientations of the first electrode 234, the pyroelectric body 232, and the second electrode 236 are continuously related.

The Pt layer 236A in the second electrode 236 is formed by sputtering, but the crystal direction of the boundary immediately after sputtering is not continuous. Therefore, an annealing process is subsequently performed to re-crystallize the Pt layer 236A. In other words, the Pt layer 236A functions as an orientation alignment layer in which the crystal orientation is aligned with the pyroelectric body 232.

The IrOx layer 236B in the second electrode 236 functions as a barrier for reductive degrading factors from above the capacitor 230. Since the IrOx layer 236B has a high resistance value, the Ir layer 236C in the second electrode 236 is used to lower the resistance value with respect to the second plug 228. The Ir layer 236C is in a metal oxide-metal relationship with the IrOx layer 236B and thus has good compatibility therewith, and can therefore have the same preferred orientation direction as the IrOx layer 236B.

In the present embodiment, the first and second electrodes 234, 236 thus have multiple layers arranged in the sequence Pt, IrOx, Ir from the pyroelectric body 232, and the materials forming the first and second electrodes 234, 236 are arranged symmetrically about the pyroelectric body 232.

However, the thicknesses of each layer of the multilayer structures forming the first and second electrodes 234, 236 are asymmetrical about the pyroelectric body 232. The total thickness T1 of the first electrode 234 and the total thickness T2 of the second electrode 236 satisfy the relationship (T1>T2) as also described above. The thermal conductivities of the Ir layer 234A, IrOx layer 234B, and Pt layer 234C of the first electrode 234 are designated as λ1, λ2, and λ3, respectively, and the thicknesses thereof are designated as T11, T12, and T13, respectively. The thermal conductivities of the Ir layer 236C, IrOx layer 236B, and Pt layer 236A are also designated as λ1, λ2, and λ3, respectively, the same as in the first electrode 234, and the thicknesses thereof are designated as T21, T22, and T23, respectively.

When the thermal conductances of the Ir layer 234A, IrOx layer 234B, and Pt layer 234C of the first electrode 234 are designated as G11, G12, and G13, respectively, G11=λ1/T11, G12=λ2/T12, and G13=λ3/T13. When the thermal conductances of the Ir layer 236C, IrOx layer 236B, and Pt layer 236A of the second electrode 236 are designated as G21, G22, and G23, respectively, G21=λ1/T21, G22=λ2/T22, and G13=λ3/T23.

Since 1/G1=(1/G11)+(1/G12)+(1/G13), the total thermal conductance G1 of the first electrode 234 is expressed by the equation (1) below.

$$G1=(G11\times G12\times G13)/(G11\times G12+G12\times G13+G11\times G13) \qquad (1)$$

In the same manner, since 1/G2=(1/G21)+(1/G22)+(1/G23), the total thermal conductance G2 of the second electrode 236 is expressed by the equation (2) below.

$$G2=(G21\times G22\times G23)/(G21\times G22+G22\times G23+G21\times G23) \qquad (2)$$

The thicknesses of each layer of the multilayer structures forming the first and second electrodes 234, 236 are substantially in the relationships described below under conditions that satisfy T11+T12+T13=T1>T2=T21+T22+T23.

Ir layers 234A, 236C T11:T21=1:0.7
IrOx layers 234B, 236B T12:T22=0.3:1
Pt layers 234C, 236A T13:T23=3:1

The reasons for adopting such layer thickness relationships are as follows. First, regarding the Ir layers 234A, 236C, since the Ir layer 234A in the first electrode 234 functions as an orientation control layer, a predetermined layer thickness is necessary in order to impart orientation properties, whereas the purpose of the Ir layer 236C of the second electrode 236 is to lower resistance, and lower resistance can be obtained the thinner the layer is.

Next, regarding the IrOx layers 234B, 236B, barrier properties against reductive obstructive factors from below and above the capacitor 230 are obtained by joint use of other barrier layers (the second layer member 214, the reducing gas barrier layer 240, and the etching stop layers/reducing gas barrier layers 140, 280), and the IrOx layer 234B of the first electrode 234 is formed having a small thickness, but the thickness of the IrOx layer 236B of the second electrode 236 is increased to compensate for low barrier properties in the second plug 228.

Lastly, regarding the Pt layers 234C, 236A, the Pt layer 234C in the first electrode 234 functions as a seed layer for determining the preferred orientation of the pyroelectric body 232, and therefore must have a predetermined layer thickness, whereas the purpose of the Pt layer 236A of the second electrode 236 is to function as an orientation alignment layer aligned with the orientation of the pyroelectric body 232, and the Pt layer 236A may therefore be formed with a smaller thickness than the Pt layer 234C in the first electrode 234.

The thickness ratio of the Ir layer 234A, IrOx layer 234B, and Pt layer 234C of the first electrode 234 is set so that T11:T12:T13=10:3:15, for example, and the thickness ratio of the Ir layer 236C, IrOx layer 236B, and Pt layer 236A of the second electrode 236 is set so that T21:T22:T23=7:10:5, for example.

The thermal conductivity $\lambda 3$ of Pt is equal to 71.6 (W/m·K), and the thermal conductivity $\lambda 1$ of Ir is equal to 147 (W/m·K), which is substantially twice the thermal conductivity $\lambda 3$ of Pt. The thermal conductivity $\lambda 2$ of IrOx varies according to the temperature or the oxygen/metal ratio (O/M), but does not exceed the thermal conductivity $\lambda 1$ of Ir. When the layer thickness relationships and thermal conductivity relationships described above are substituted into Equations (1) and (2) to calculate the size relationship between G1 and G2, it is apparent that G1<G2. Thus, even when the first and second electrodes 234, 236 are provided with a multilayer structure as in the present embodiment, the expression G1<G2 is satisfied from the relationship of the thermal conductivities and layer thicknesses.

When the first electrode 234 has the adhesive layer 234D on the bonded surface with the support member 210 as described above, the thermal conductance G1 of the first electrode 234 is reduced, and the relationship G1<G2 is easily satisfied.

Since the etching mask of the capacitor 230 degrades as etching proceeds, the side walls of the capacitor 230 acquire a tapered shape which is narrower at the top and wider at the bottom as shown in FIG. 6, the more layers are added to the structure. However, since the taper angle with respect to the horizontal surface is about 80 degrees, considering that the total height of the capacitor 230 is on the order of nanometers, the increase in surface area of the first electrode 234 with respect to the second electrode 236 is small. The amount of heat transferred by the first electrode 234 can thereby be kept smaller than the amount of heat transferred by the second electrode 236, based on the relationship between the thermal conductance values of the first and second electrodes 234, 236.

5.3 Modifications of Capacitor Structure

A single-layer structure and multilayer structure are described above for the first and second electrodes 234, 236 of the capacitor 230, but various other combinations of structures are possible which produce the thermal conductance relationship G1<G2 while maintaining the function of the capacitor 230.

First, the Ir layer 236C of the second electrode 236 may be omitted. The reason for this is that in this case, the object of lowering resistance is achieved in the same manner when Ir, for example, is used as the material of the second plug 228. Through this configuration, since the thermal conductance G2 of the second electrode 236 is greater than in the case shown in FIG. 6, the relationship G1<G2 is easily satisfied. A reflective surface for defining L=$\lambda$/4 shown in FIG. 6 takes the place of the Pt layer 236A of the second electrode 236 in this case, but a multiple reflection surface can be ensured in the same manner.

Next, the thickness of the IrOx layer 236B in the second electrode 236 in FIG. 6 may be made equal to or less than the thickness of the IrOx layer 234B in the first electrode 234. As described above, since the barrier properties against reductive obstructive factors from below and above the capacitor 230 are obtained by joint use of other barrier layers (the second layer member 214, the reducing gas barrier layer 240, and the etching stop layers/reducing gas barrier layers 140, 280), when the reducing gas barrier properties in the second plug 228 are increased by the configuration shown in FIG. 5, for example, there is no need for the thickness of the IrOx layer 236B in the second electrode 236 to be greater than the thickness of the IrOx layer 234B in the first electrode 234. Through this configuration, the thermal conductance G2 of the second electrode 236 further increases, and the relationship G1<G2 is easier to obtain.

Next, the IrOx layer 234B in the first electrode 234 in FIG. 6 may be omitted. Crystal continuity between the Ir layer 234A and the Pt layer 234C is not hindered by omission of the IrOx layer 234B, and no problems occur with regard to crystal orientation. When the IrOx layer 234B is omitted, the capacitor 230 has no barrier layer with respect to reductive obstructive factors from below the capacitor 230. However, the second layer member 214 is present in the support member 210 for supporting the capacitor 230, and the etching stop layer 140 is present on the lower surface of the support member 210, and when the second layer member 214 and the etching stop layer 140 are formed by layers having reducing gas barrier properties, barrier properties with respect to reductive obstructive factors from below the capacitor 230 can be ensured in the capacitor 230.

When the IrOx layer 234B in the first electrode 234 is omitted in this arrangement, the thermal conductance G1 of the first electrode 234 increases. It may therefore be necessary to increase the thermal conductance G2 of the second electrode 236 as well in order to obtain the relationship G1<G2. In this case, the IrOx layer 236B in the second electrode 236 may be omitted, for example. Once the IrOx layer 236B is omitted, the Ir layer 236C is also no longer necessary. The reason for this is that the Pt layer 236A functions as a low-resistance layer in place of the Ir layer 236C. Barrier properties with respect to reductive obstructive factors from above the capacitor 230 can be maintained by the first reducing gas barrier layer 240 described above, the barrier metal 228A shown in FIG. 4, or the reducing gas barrier layer 290 shown in FIG. 5.

When the second electrode 236 shown in FIG. 6 is formed only by the Pt layer 236A as described above, the first electrode 234 may be formed by the Pt layer 234C as a single layer, by the Ir layer 234A and Pt layer 234C as two layers, or by the Ir layer 234A of FIG. 6, the IrOx layer 234B, and the Pt layer 234C as three layers. In any of these cases, the relationship G1<G2 can easily be obtained by making the thickness T13 of the Pt layer 234C of the first electrode 234 greater than the thickness T23 of the Pt layer 236A of the second electrode 236 (T13>T23), for example.

As described above, in the present embodiment, platinum (Pt) or iridium (Ir) is used as the material (single-layer electrode material in the case of single-layer electrodes, and the electrode material of the uppermost layer in the case of multi-layer electrodes) for forming the first and second electrodes 234, 236 in the portion connected to the first and second plugs 226, 228. In any case, by using titanium nitride (TiN) or titanium aluminum nitride (TiAlN), for example, as the first and second electrode wiring layers 222, 224, the thermal conductivity of the first and second electrode wiring layers 222, 224 can be made lower than the thermal conductivity of the first and second electrodes 234, 236, and the thermal separation characteristics of the pyroelectric infrared detector 200 can be improved.

Figure 7:
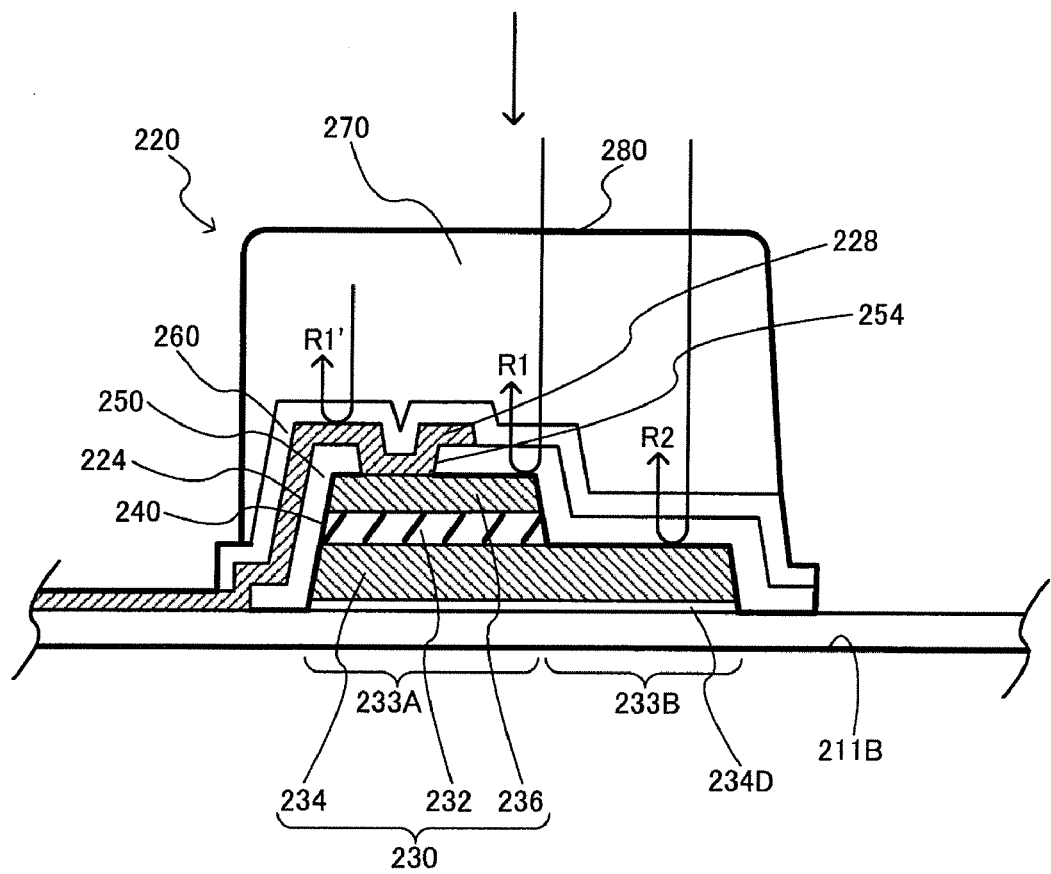
FIG. 7 is a simplified sectional view showing the pyroelectric infrared detector in which the infrared-absorbing layer is disposed in a different region.

6. Enhancement of Infrared Absorption Efficiency by Reflection by Electrode Surfaces FIG. 7 is a sectional view showing a modification in which the region in which the infrared-absorbing layer 270 of FIG. 3 is disposed is enlarged. The enhancement of infrared absorption efficiency by reflection by the electrode surfaces in the embodiments shown in FIGS. 3 and 7 will be described using FIG. 7.

A portion of the infrared rays incident from the direction of the arrow in FIG. 7 is absorbed by the infrared-absorbing layer 270 and converted to heat, and the remainder of the infrared rays is transmitted. At this time, in the embodiments shown in FIGS. 3 and 7, the transmitted infrared rays are reflected on the surface of the second electrode (upper electrode) 236 and returned toward the center of the infrared-absorbing layer 270 (R1 in FIG. 7). Through this reflection, the transmitted infrared rays are given another opportunity to be absorbed by the infrared-absorbing layer 270, and the infrared absorption efficiency is therefore increased.

Infrared rays are reflected not only at the second electrode (upper electrode) 236, but also at the second electrode wiring layer 224 (R1' in FIG. 7). However, the maximum absorption occurs at different height points within the infrared-absorbing layer 270 for the infrared rays reflected at the second electrode (upper electrode) 236 and the infrared rays reflected at the second electrode wiring layer 224. The infrared absorption efficiency therefore decreases. Although the maximum absorption of the infrared rays reflected at the second electrode (upper electrode) 236 occurs at a constant height point when the second electrode wiring layer 224 is not present, the second electrode wiring layer 224 is necessary.

Therefore, by reducing the width W22 of the second electrode wiring layer 224 as described above, a reduction in infrared absorption efficiency can be suppressed.

In the embodiment shown in FIG. 7, the infrared-absorbing layer 270 is disposed also in a position opposite the second region 233B in which the first electrode (lower electrode) 234 is enlarged. Through this configuration, the volume of the infrared-absorbing layer 270 is increased, and not only is the amount of heat absorbed therefore increased, but infrared rays can also be reflected at the first electrode (lower electrode) 234 (R2 in FIG. 7). The amount of heat absorbed by the infrared-absorbing layer 270 is therefore further increased.

At the same time that infrared rays are reflected at the first electrode (lower electrode) 234, infrared rays are reflected by the first electrode wiring layer 222 (omitted in FIG. 7) as well, and the same problem occurs as in the second electrode. However, a reduction in infrared absorption efficiency can be suppressed by reducing the width W12 of the first electrode wiring layer 222 as described above.

7. Electronic Instrument

Figure 8:
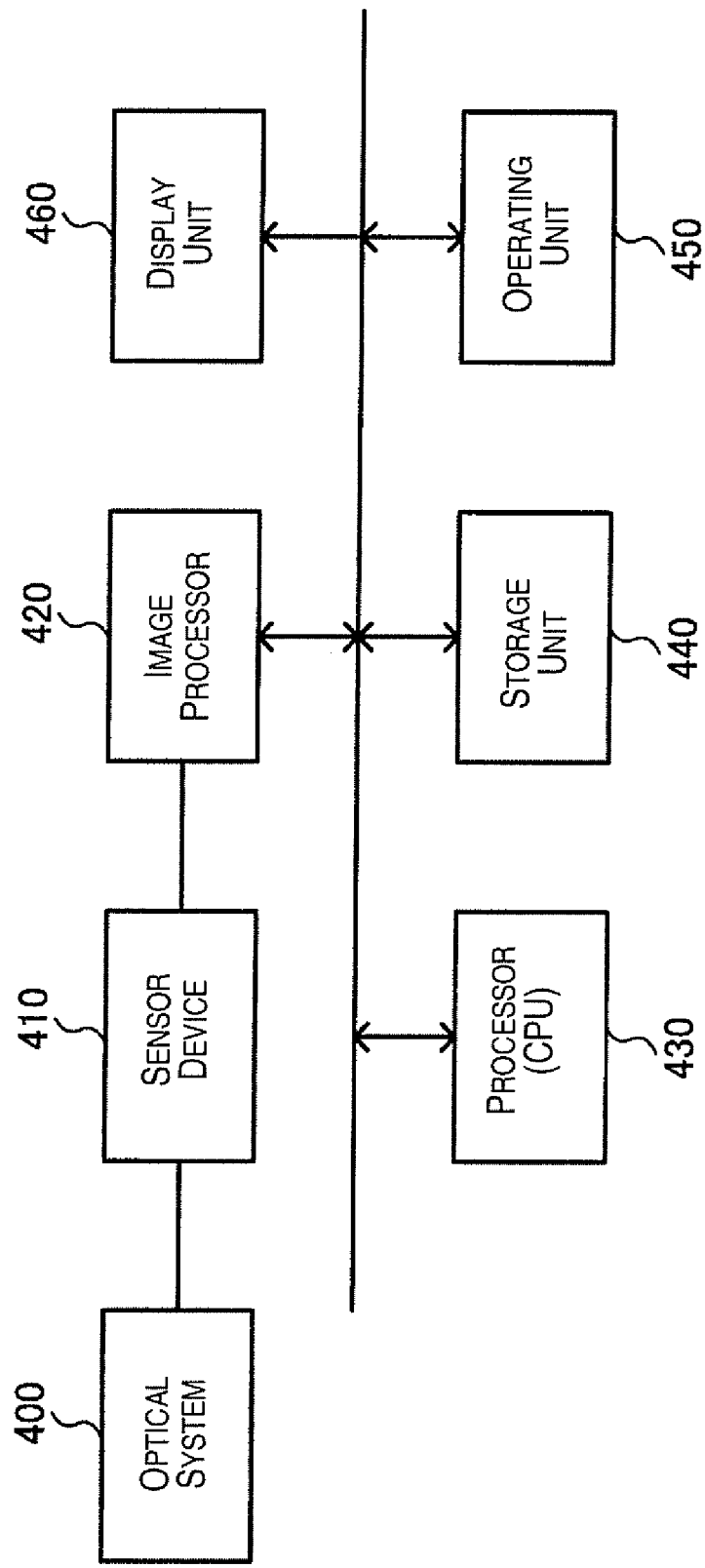
FIG. 8 is a block diagram showing the electronic instrument which includes the thermo-optical detector or thermo-optical detection device.

FIG. 8 shows an example of the configuration of an electronic instrument which includes the pyroelectric detector or pyroelectric detection device of the present embodiment. The electronic instrument includes an optical system 400, a sensor device (pyroelectric detection device) 410, an image processor 420, a processor 430, a storage unit 440, an operating unit 450, and a display unit 460. The electronic instrument of the present embodiment is not limited to the configuration shown in FIG. 8, and various modifications thereof are possible, such as omitting some constituent elements (e.g., the optical system, operating unit, display unit, or other components) or adding other constituent elements.

The optical system 400 includes one or more lenses, for example, a drive unit for driving the lenses, and other components. Such operations as forming an image of an object on the sensor device 410 are also performed. Focusing and other adjustments are also performed as needed.

The sensor device 410 is formed by arranging the pyroelectric detector 200 of the present embodiment described above in two dimensions, and a plurality of row lines (word lines, scan lines) and a plurality of column lines (data lines) are provided. In addition to the optical detector arranged in two dimensions, the sensor device 410 may also include a row selection circuit (row driver), a read circuit for reading data from the optical detector via the column lines, an A/D conversion unit, and other components. Image processing of an object image can be performed by sequentially reading data from detectors arranged in two dimensions.

The image processor 420 performs image correction processing and various other types of image processing on the basis of digital image data (pixel data) from the sensor device 410.

The processor 430 controls the electronic instrument as a whole and controls each block within the electronic instrument. The processor 430 is realized by a CPU or the like, for example. The storage unit 440 stores various types of information and functions as a work area for the processor 430 or the image processor 420, for example. The operating unit 450 serves as an interface for operation of the electronic instrument by a user, and is realized by various buttons, a GUI (graphical user interface) screen, or the like, for example. The display unit 460 displays the image acquired by the sensor device 410, the GUI screen, and other images, for example, and is realized by a liquid crystal display, an organic EL display, or another type of display.

A pyroelectric detector of one cell may thus be used as an infrared sensor or other sensor, or the pyroelectric detector of one cell may be arranged along orthogonal axes in two dimensions to form the sensor device 410, in which case a heat (light) distribution image can be provided. This sensor device 410 can be used to form an electronic instrument for thermography, automobile navigation, a surveillance camera, or another application.

As shall be apparent, by using one cell or a plurality of cells of pyroelectric detectors as a sensor, it is possible to form an analysis instrument (measurement instrument) for analyzing (measuring) physical information of an object, a security instrument for detecting fire or heat, an FA (factory automation) instrument provided in a factory or the like, and various other electronic instruments.

Figure 9A:
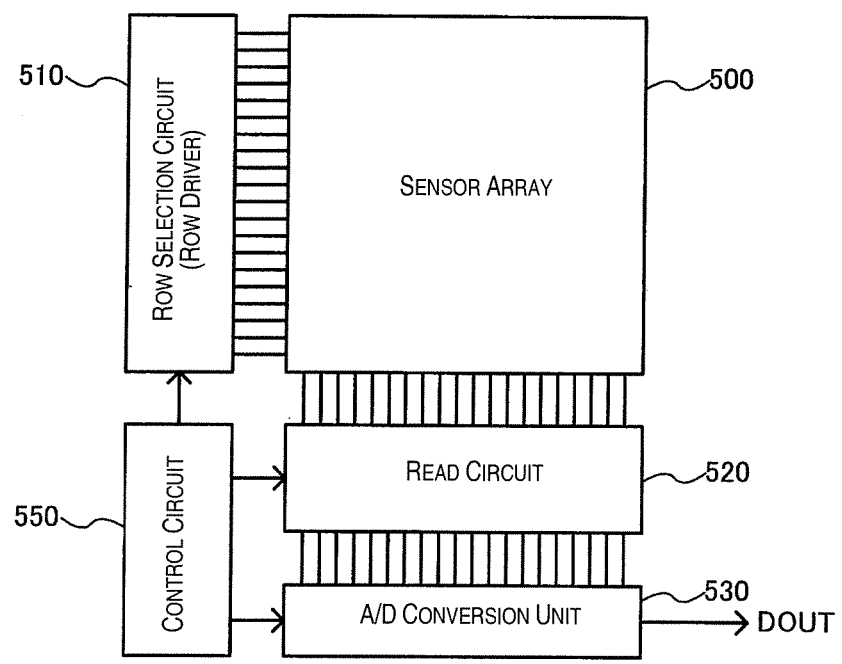
FIGS. 9A and 9B are views showing an example of the configuration of a pyroelectric detection device in which pyroelectric detectors are arranged in two dimensions.

FIG. 9A shows an example of the configuration of the sensor device 410 shown in FIG. 10. This sensor device includes a sensor array 500, a row selection circuit (row driver) 510, and a read circuit 520. An A/D conversion unit 530 and a control circuit 550 may also be included. An infrared camera or the like used in a night vision instrument or the like, for example, can be realized through the use of the sensor device described above.

A plurality of sensor cells is arrayed (arranged) along two axes as shown in FIG. 2, for example, in the sensor array 500. A plurality of row lines (word lines, scan lines) and a plurality of column lines (data lines) are also provided. The number of either the row lines or the column lines may be one. In a case in which there is one row line, for example, a plurality of sensor cells is arrayed in the direction (transverse direction) of the row line in FIG. 9A. In a case in which there is one column line, a plurality of sensor cells is arrayed in the direction (longitudinal direction) of the column line.

Figure 9B:
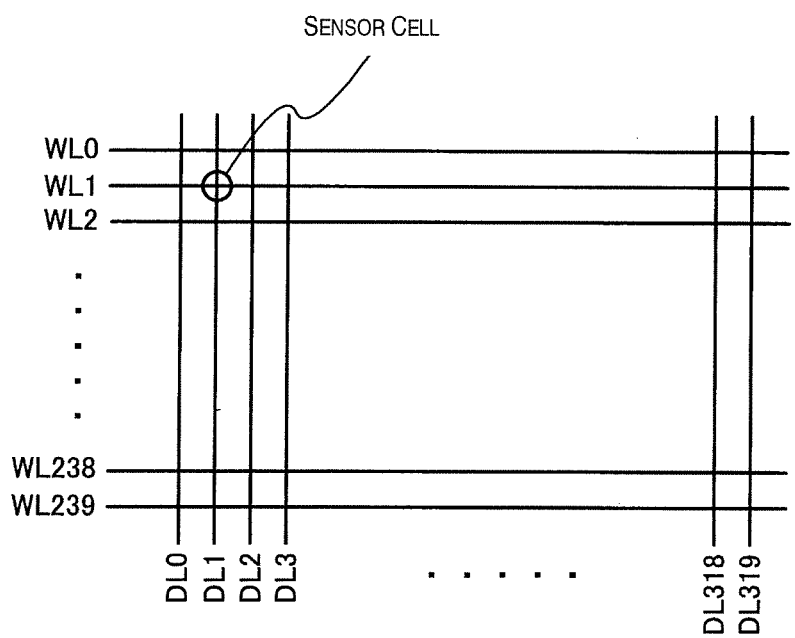

As shown in FIG. 9B, the sensor cells of the sensor array 500 are arranged (formed) in locations corresponding to the intersection positions of the row lines and the column lines. For example, a sensor cell in FIG. 9B is disposed at a location corresponding to the intersection position of word line WL1 and column line DL1. Other sensor cells are arranged in the same manner.

The row selection circuit 510 is connected to one or more row lines, and selects each row line. Using a QVGA (320×240 pixels) sensor array 500 (focal plane array) such as the one shown in FIG. 9B as an example, an operation is performed for sequentially selecting (scanning) the word lines WL0, WL1, WL2, . . . WL239. In other words, signals (word selection signals) for selecting these word lines are outputted to the sensor array 500.

The read circuit 520 is connected to one or more column lines, and reads each column line. Using the QVGA sensor array 500 as an example, an operation is performed for reading detection signals (detection currents, detection charges) from the column lines DL0, DL1, DL2, . . . DL319.

The A/D conversion unit 530 performs processing for A/D conversion of detection voltages (measurement voltages, attained voltages) acquired in the read circuit 520 into digital data. The A/D conversion unit 530 then outputs the A/D converted digital data DOUT. Specifically, the A/D conversion unit 530 is provided with A/D converters corresponding to each of the plurality of column lines. Each A/D converter performs A/D conversion processing of the detection voltage acquired by the read circuit 520 in the corresponding column line. A configuration may be adopted in which a single A/D converter is provided so as to correspond to a plurality of column lines, and the single A/D converter is used in time division for A/D conversion of the detection voltages of a plurality of column lines.

The control circuit 550 (timing generation circuit) generates various control signals and outputs the control signals to the row selection circuit 510, the read circuit 520, and the A/D conversion unit 530. A control signal for charging or discharging (reset), for example, is generated and outputted. Alternatively, a signal for controlling the timing of each circuit is generated and outputted.

Several embodiments are described above, but it will be readily apparent to those skilled in the art that numerous modifications can be made herein without substantively departing from the new matter and effects of the present invention. All such modifications are thus included in the scope of the present invention. For example, in the specification or drawings, terms which appear at least once together with different terms that are broader or equivalent in meaning may be replaced with the different terms in any part of the specification or drawings.

The present invention is broadly applicable to various pyroelectric detectors (e.g., thermocouple-type elements (thermopiles), pyroelectric elements, bolometers, and the like), irrespective of the wavelength of light detected. The pyroelectric detector or pyroelectric detection device, or the electronic instrument which has the pyroelectric detector or pyroelectric detection device, may also be applied to a flow sensor or the like for detecting the flow rate of a liquid under conditions in which an amount of supplied heat and an amount of heat taken in by the fluid are in equilibrium. The pyroelectric detector or pyroelectric detection device of the present invention may be provided in place of a thermocouple or the like provided to the flow sensor. The pyroelectric detector or pyroelectric detection device of the present invention may be provided in place of a thermocouple or the like provided to the flow sensor, and a subject other than light may be detected.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A pyroelectric detector comprising:
a support member including a first side and a second side opposite from the first side, with the second side facing a cavity; and
a pyroelectric detection element mounted on the first side of the support member, the pyroelectric detection element including a capacitor including a first electrode, a pyroelectric body and a second electrode, the first electrode being mounted on the support member and including a first region in which the pyroelectric body is disposed and a second region extending from the first region, the pyroelectric body being disposed over the first electrode in the first region, and the second electrode being disposed over the pyroelectric body, an interlayer insulation layer covering a surface of the capacitor, and forming a first contact hole passing through to the first electrode in the second region, and a second contact hole passing through to the second electrode, a first plug embedded in the first contact hole, a second plug embedded in the second contact hole, a first electrode wiring layer formed on the interlayer insulation layer and on the first side of the support member, and connected to the first plug, and a second electrode wiring layer formed on the interlayer insulation layer and on the first side of the support member, and connected to the second plug, a thermal conductivity of material of the second electrode wiring layer being lower than a thermal conductivity of material of a portion of the second electrode connected to the second plug.

2. The pyroelectric detector according to claim 1, wherein a thermal conductivity of material of the first electrode wiring layer is lower than a thermal conductivity of material of a portion of the first electrode connected to the first plug.

3. The pyroelectric detector according to claim 1, wherein at least one of the first electrode wiring layer and the second electrode wiring layer contains one of titanium nitride and titanium aluminum nitride.

4. The pyroelectric detector according to claim 1, wherein a thermal conductance of the second electrode is greater than a thermal conductance of the first electrode.

5. The pyroelectric detector according to claim 1, wherein the pyroelectric detection element further includes a light-absorbing member disposed in a region further upstream in a light incidence direction than the second electrode and the second wiring layer.

6. The pyroelectric detector according to claim 1, further comprising
a reducing gas barrier layer disposed between the interlayer insulation layer and the capacitor.

7. A pyroelectric detection device comprising:
a plurality of the pyroelectric detectors according to claim 1 arranged in two dimensions along two axes.

8. An electronic instrument comprising:
the pyroelectric detector according to claim 1.

9. A pyroelectric detection device comprising:
a plurality of the pyroelectric detectors according to claim 2 arranged in two dimensions along two axes.

10. A pyroelectric detection device comprising:
a plurality of the pyroelectric detectors according to claim 3 arranged in two dimensions along two axes.

11. A pyroelectric detection device comprising:
a plurality of the pyroelectric detectors according to claim 4 arranged in two dimensions along two axes.

12. The pyroelectric detector according to claim 5, wherein
the light-absorbing member covers an entire surface of the second electrode in plan view as viewed along the light incidence direction, and
the second electrode covers an entire surface of a first side of the pyroelectric body that is opposite from a second side facing the first electrode.

13. The pyroelectric detector according to claim 5, wherein
the light-absorbing member overlaps with the first region of the first electrode and at least a portion of the second region of the first electrode in plan view as viewed along the light incidence direction.

14. The pyroelectric detector according to claim 5, wherein
the first electrode wiring layer includes a first connecting part connected to the first plug, and a first lead wiring part extending from the first connecting part and having a width smaller than a width of the first connecting part,
the second electrode wiring layer includes a second connecting part connected to the second plug, and a second lead wiring part extending from the second connecting part and having a width smaller than a width of the second connecting part, and
the width of the second lead wiring part is less than a maximum length in a transverse-cross section of the second contact hole.

15. A pyroelectric detection device comprising:
a plurality of the pyroelectric detectors according to claim 5 arranged in two dimensions along two axes.

16. An electronic instrument comprising:
the pyroelectric detection device according to claim 7.

17. A pyroelectric detection device comprising:
a plurality of the pyroelectric detectors according to claim 12 arranged in two dimensions along two axes.

18. A pyroelectric detection device comprising:
a plurality of the pyroelectric detectors according to claim 13 arranged in two dimensions along two axes.

19. The pyroelectric detector according to claim 14, wherein
the width of the first lead wiring part is less than the maximum length in a transverse cross-section of the first contact hole.

20. A pyroelectric detection device comprising:
a plurality of the pyroelectric detectors according to claim 14 arranged in two dimensions along two axes.

* * * * *